United States Patent [19]

Sakata et al.

[11] Patent Number: 5,255,215
[45] Date of Patent: * Oct. 19, 1993

[54] DIGITAL FILTER SYSTEM WITH CHANGEABLE CUTOFF FREQUENCY

[75] Inventors: Goro Sakata, Mitaka; Kikuji Tanaka, Fussa; Kohtaro Hanzawa, Iruma; Ryutaro Hayashi, Tachikawa, all of Japan

[73] Assignee: Casio Computer Co., Ltd., Tokyo, Japan

[*] Notice: The portion of the term of this patent subsequent to Aug. 18, 2009 has been disclaimed.

[21] Appl. No.: 872,922

[22] Filed: Apr. 23, 1992

Related U.S. Application Data

[62] Division of Ser. No. 608,572, Nov. 2, 1990, Pat. No. 5,140,541.

Foreign Application Priority Data

Nov. 7, 1989 [JP] Japan .................................. 1-288020
Dec. 30, 1989 [JP] Japan .................................. 1-341504

[51] Int. Cl.⁵ ............................................. G06F 15/31
[52] U.S. Cl. ............................ 364/724.19; 364/724.01
[58] Field of Search ........... 364/724.19, 724.2, 724.01; 84/DIG. 9

[56] References Cited

U.S. PATENT DOCUMENTS 4,494,214  1/1985  Bernard et al. ................. 364/724.19
4,791,390 12/1988  Harris et al. ................... 364/724.19
4,829,463  5/1989  Kakishita et al. .............. 364/724.19
4,843,938  7/1989  Hideo ............................. 84/DIG. 9

Primary Examiner—David H. Malzahn
Attorney, Agent, or Firm—Frishauf, Holtz, Goodman & Woodward

[57] ABSTRACT

Using stored discrete samples of filter coefficients at each of a plurality of discrete operating points, a filter control (e.g., CPU) provides dynamic control of a digital filter through an interpolator in accordance with a variable input indicative of a desired operating point (e.g., cutoff frequency) of the digital filter. In response to a large change in the desired operating point, the control produces a succession of operating point subgoals progressively approaching the changed desired operating point and a corresponding succession of filter coefficient subgoals. Each filter coefficient subgoal is calculated as a function of stored discrete filter coefficient samples near each operating point subgoal. In response to a new parameter set from the filter control, containing a new subgoal of the coefficients, the interpolator starts coefficient interpolating to smoothly move the operating point of the digital filter toward the new subgoal. By starting the interpolating operations after the updating of the parameter set has been completed, synchronization may be established among the interpolating operations on the coefficients.

18 Claims, 27 Drawing Sheets

$b1 = 2(A^2-1)/(A^2+2aA+1)$
$b2 = (A^2-2aA+1)/(A^2+2aA+1)$
$K = (1+b1+b2)/4$

WHERE  $a = \cos 45°$
$A = \tan(fc\pi/fs)$
fc: CUTOFF FREQUENCY
fs: SAMPLING FREQUENCY

DIGITAL FILTER SYSTEM WITH CHANGEABLE CUTOFF FREQUENCY

This is a division of application Ser. No. 07/608,572 filed Nov. 2, 1990, now U.S. Pat. No. 5,140,541.

BACKGROUND OF THE INVENTION

1. Field of the Invention

The invention relates to a digital filter based system which digitally filters a signal to be processed.

2. Description of the Prior Art

In certain applications of digital filters such as in electronic musical instruments, it is desired to dynamically control or change filter characteristics. For example, the cutoff frequency is a filter factor indicative of a boundary frequency between the filter pass band and the transition band. A tone quality and/or timber can be varied by changing the cutoff frequency. Though possible, to directly compute respective coefficients in the digital filter transfer function (filter coefficients) from a given cutoff frequency requires a considerable amount of time because such computation involves calculating complicated functions such as trigometric functions. The direct computation imposes too much of a burden on a system control unit such as a CPU which must handle other processes.

In this view, it has been proposed to provide a coefficient memory (look-up table) which stores filter coefficients for various values of the cutoff frequency. When a desired cutoff frequency is given, it is converted to corresponding filter coefficients by accessing the coefficient memory using the given frequency. However, to store filter coefficients for all possible values of the cutoff frequency, a very large look-up table is required.

In some digital filter systems, a desired value of the cutoff frequency can be changed. In response to such change, if operative filter coefficients used in a digital filter circuit are changed instantly from those coefficient values at the cutoff frequency before the change to those coefficients at the cutoff frequency after the change, then noise occurs, giving rise to a serious problem in the sound generating application.

To avoid this, it was proposed to provide an interpolator which inserts a succession of interpolated filter coefficients between the coefficient values at the cutoff frequencies before and after the change, as disclosed in Japanese Patent Publication Kokoku Sho63-36577. The disclosed system successively adds or subtracts a predetermined value to and from current filter coefficients (initially set to those coefficients at the cutoff frequency before the change) to develop an interpolated coefficient succession until the coefficients at the cutoff frequency after the change are reached. The interpolated filter coefficients produced by this system, however, contain errors or deviations from desired or ideal filter coefficient values. In particular, for a larger difference between the cutoff frequencies before and after the change, the errors are greatly increased, transiently producing a tone with a resonating component which sounds unnatural to the user.

Electronic musical instruments typically employ a polyphonic tone generator having a plurality of voice channels capable of producing a plurality of tones at the same time. Similarly, digital filters are often configured to process a plurality of signals using time-division multiplexing (TDM). Such a multiplexing technique is often applied to the interpolator discussed above.

A TDM-based interpolator requires a large number of parameters for interpolation. The number of the required parameters, which include goal values of the filter coefficients determining the cutoff frequency after the change and differential values, is three times the number of filter coefficients. Thus, it takes a considerable amount of time for an external parameter updating device, typically implemented by a CPU of a microcomputer to transfer a new set of parameters to the interpolator. Moreover, the CPU operates asynchronously with the interpolator, bringing forth another problem as to when the interpolator uses the new set of parameters for the interpolation.

Unfortunately, the prior art interpolator automatically accesses an internal parameter memory, the contents of which are externally updated, without knowing when the updating occurs. This produces timing errors among the plurality of interpolated data items. In particular, in digital filters using filter coefficients having a high sensitivity, filter characteristics tend to deviate from the desired characteristics because of such timing errors or sampling skews, thus resulting in an unnatural sound.

In summary, in the prior art, interpolating operations, which should start simultaneously for a new set of parameters, actually start at different times from one coefficient to another.

SUMMARY OF THE INVENTION

Therefore, an object of the invention is to provide a digital filter system capable of smoothly changing or moving the cutoff frequency while substantially maintaining filter characteristics in a region near the cutoff frequency in response to any change including a large one in the desired cutoff frequency value.

In accordance with an aspect of the invention, there is provided a digital filter system which comprises:

filter coefficient storage means for storing filter coefficients corresponding to each of a plurality of discrete cutoff frequencies;

goal storage means for storing a goal value of cutoff frequency;

coefficient interpolating means for interpolating filter coefficients at the goal value of the cutoff frequency based on those filter coefficients stored in said filter coefficient storage means and corresponding to cutoff frequencies near the goal value;

filtering means for receiving filter coefficients from said coefficient interpolating means and for filtering an input signal in accordance with the received filter coefficients;

desired cutoff frequency varying means for varying a desired value of the cutoff frequency;

detecting means for detecting a difference between the desired value from said desired cutoff frequency varying means and the goal value stored in said goal storage means;

updating means responsive to said detecting means when said difference is relatively large for calculating a new goal value that is located between said goal value and said desired value and for updating said goal storage means by said new goal value; and repeating means for repeating operations of said detecting means, said updating means and said coefficient interpolating means until said difference is reduced to a relatively small value.

With this arrangement, even if the desired value of the cutoff frequency is changed greatly, the goal value of the cutoff frequency is changed little by little. Filter coefficients at each goal value of the cutoff frequency are best approximated by interpolation using stored and highly accurate filter coefficients near the goal value of the cutoff frequency. This provides smooth movement or shifting of the cutoff frequency while keeping the characteristic shape of the filter.

Another object of the invention is to provide a digital filter system capable of smoothly moving the operating point (e.g., cutoff frequency) of a digital filter in response to any change in the desired operating point.

In accordance with another aspect of the invention, there is provided a digital filter system which comprises:

a digital filter;

filter coefficient storage means for storing filter coefficients corresponding to each of a plurality of discrete operating points of said digital filter;

goal storage means for storing a goal of operating point;

coefficient interpolating means for interpolating filter coefficients at the goal of the operating point based on those filter coefficients stored in said filter coefficient storage means and corresponding to operating points near the goal;

transferring means for transferring filter coefficients from said coefficient interpolating means to said digital filter;

desired operating point varying means for varying a desired operating point;

detecting means for detecting a difference between the desired operating point from said desired operating point varying means and the goal stored in said goal storage means;

updating means responsive to said detecting means when said difference is relatively large for calculating a new goal that is located between said goal and said desired operating point and for updating said goal storage means by said new goal; and repeating means for repeating operations of said detecting means, said updating means and said coefficient interpolating means until said difference is reduced to a relatively small value.

The operating point refers to one or more operating properties of a digital filter. Cutoff frequency, cutoff slope, Q factor, degree of resonance, and any combination thereof are examples of the operating point.

Another object of the invention is to provide a smoother change in the filter coefficients used for digital filtering in response to any large change in the desired value of the cutoff frequency while keeping filter characteristics near the cutoff frequency.

In accordance with an aspect of the invention, there is provided a digital filter system which comprises:

filter coefficient storage means for storing filter coefficients corresponding to each of a plurality of discrete cutoff frequencies;

goal storage means for storing a goal value of cutoff frequency;

coefficient interpolating means for interpolating filter coefficients at the goal value of the cutoff frequency based on those filter coefficients stored in said filter coefficient storage means and corresponding to cutoff frequencies near the goal value;

desired cutoff frequency varying means for varying a desired value of the cutoff frequency;

measuring means for measuring a difference between a desired value of the cutoff frequency newly supplied from said desired cutoff frequency varying means and the goal value of the cutoff frequency as an old goal value from said goal storage means;

updating means responsive to said measuring means when said difference is relatively large for calculating a new goal value of the cutoff frequency that is located between said old goal value and said desired value newly supplied and for updating said goal storage means by replacing said old goal value with said new goal value;

changing rate calculating means for calculating changing rates of filter coefficients that are variables in proportion to differences between those filter coefficients at said old goal value and those filter coefficients at said new goal value; and filtering means for receiving filter coefficients from said coefficient interpolating means and changing rates from said changing rate calculating means and for filtering an input signal in accordance with the received filter coefficients and changing rates.

In this arrangement, the filtering means may smoothly change the filter coefficients used for filtering an input signal because the changing rates in proportion to the differences between those filter coefficients at an old (previous) goal value of the cutoff frequency and those filter coefficients at a new goal value of the cutoff frequency are calculated and supplied to the filtering means.

Further, the invention provides a digital filter system which comprises:

filter coefficient storage means for storing filter coefficients corresponding to each of a plurality of discrete cutoff frequencies;

desired cutoff frequency varying means for varying a desired value of cutoff frequency;

goal calculating means responsive to when a difference between a newly desired value of the cutoff frequency from said desired cutoff frequency varying means and an old goal value of the cutoff frequency is larger than a predetermined value for calculating a new goal value of the cutoff frequency having a reduced difference, smaller than said difference, from said old goal value;

coefficient interpolating means for interpolating filter coefficients at said new goal value based on those filter coefficients stored in said coefficient storage means and corresponding to cutoff frequencies near said new goal value; and filtering means for filtering an input signal in accordance with filter coefficients from said coefficient interpolating means.

With this arrangement, the goal calculating means will produce a succession of goal values of the cutoff frequency in response to a succession of desired values of the cutoff frequency from desired cutoff frequency varying means. The difference of the succession of the goal values is kept at a relatively small value even if a large change occurs in the desired cutoff frequency. The coefficient interpolating means will interpolate (calculate) filter coefficients at each goal value of the cutoff frequency in the succession of goal values, using those filter coefficients stored in the filter coefficient storage means and corresponding to the discrete cutoff frequencies near the goal value. The interpolated filter coefficients are used by the filtering means for filtering an input signal. As a response to a large change in the desired cutoff frequency, the coefficients interpolating means will produce a succession of interpolated filter coefficients that are located at points on a path formed by linking a succession of discrete and accurate filter coefficients stored in the filter coefficient memory. Errors in the interpolated filter coefficients from ideal values are minimized. It is possible, therefore to move or change the operative cutoff frequency while maintaining filter characteristics around the cutoff frequency as a response to a large change in the desired cutoff frequency.

Another object of the invention is to provide an interpolator for a digital filter capable of updating all parameters required for interpolation (calculation) of operating filter coefficients at the same time to enable simultaneous initiating (restarting) of a new cycle of interpolating filter coefficients using the parameters all updated.

In accordance with an aspect of the invention, there is provided an interpolator for a digital filter which comprises:

interpolating means for repeatedly processing, for each of a plurality of filter coefficients, an old coefficient value with a supplied differential value to produce a new coefficient value approaching toward a supplied goal value;

supplying means for supplying a new set of parameters comprising new differential values and new goal values for said plurality of filter coefficients;

control signal supplying means for supplying a control signal indicative of completion of said supplying by said supplying means;

simultaneous means responsive to said control signal for causing said interpolating means to start said processing using said new set of parameters.

transferring means for transferring each coefficient value from said interpolating means to said digital filter.

With this arrangement, under the control of the control signal, samples (current values) of a plurality of filter coefficients are interpolated in substantial synchronism with one another. Therefore, it is possible to provide accurate control of the digital filter characteristics from outside by way of the interpolator.

The invention further provides an interpolator for a digital filter which comprises:

current value storage means for storing a current value of each of a plurality of filter coefficients;

goal value storage means for storing a goal value of each of said plurality of filter coefficients;

differential value storage means for storing a differential value of each of said plurality of filter coefficients;

interpolating means for repeatedly performing interpolation which comprises producing, on a time division multiplexing basis, a new current value of each of said plurality of filter coefficients from said stored current value and said differential value in such a manner that said new current value is directed toward said stored goal value, and writing said new current value into said current value storage means;

transferring means for transferring said new current value of each of said plurality of filter coefficients to said digital filter;

parameter updating means for updating said goal value storage means and said differential value storage means by respectively writing new goal values and new differential values that are supplied externally; and inhibit/restart means for inhibiting said interpolating means from performing said interpolation in accordance with a control signal externally supplied during a period of said updating by said parameter updating means, and for restarting said interpolating means for performing said interpolation in response to a change of said control signal indicative of end of said updating.

With this arrangement, operation of the interpolating means is inhibited during the period in which the parameter set of goal and differential values are being updated. This serves to minimize the storage capacity of the goal and differential value storage means. The means for inhibiting the interpolation may be readily implemented by a simple curcuit such as a selector.

A further object of the invention is to provide an interpolator for a digital filter capable of continuously performing interpolation of filter coefficients.

The invention provides an interpolator for a digital filter which comprises:

current value storage means for storing a current value of each of a plurality of filter coefficients;

first goal value storage means for storing a first goal value of each of said plurality of filter coefficients;

second goal value storage means for storing a second goal value of each of said plurality of filter coefficients;

first differential value storage means for storing a first differential value of each of said plurality of filter coefficients;

second differential value storage means for storing a second differential value of each of said plurality of filter coefficients;

interpolating means for repeatedly performing interpolation which comprises producing, on a time division multiplexing basis, a new current value of each of said plurality of filter coefficients from said stored current value and an active differential value in such a manner that said new current value is directed toward an active goal value, and writing said new current value into said current value storage means;

transferring means for transferring said new current value to said digital filter;

mode switching means responsive to a control signal externally supplied for switching said interpolating means in accordance with levels of said control signal between a first mode in which said interpolating means uses said first goal value as said active goal value and uses said first differential value as said active differential value, and a second mode in which said interpolating means uses said second goal value as said active goal value and uses said second differential value as said active differential value; and parameter updating means responsive to said control signal for updating said second goal value storage means and said second differential value storage means with a new goal value and new differential value of each of said plurality of filter coefficients, externally supplied during a first level period of said control signal and for updating said first goal value storage means and said first differential value storage means with a new goal value and new differential value of each of said plurality of filter coefficients, externally supplied during a second level of said control signal.

In this arrangement, the goal and differential value storage means is separated into two banks. At a given time, the first bank stores active parameters and the second bank stores updated parameters while at another time the first bank is for (further) updated parameters and the second bank is for active parameters. Though it requires an increased storage capacity for parameters, the interpolator can continue interpolation to enable more continuous control of the digital filter.

In accordance with the invention, each of the digital filter system described in this section may be combined with any of the interpolators described in this section.

DETAILED DESCRIPTION OF THE PREFERRED EMBODIMENTS

The invention will now be described in more detail by way of illustrative embodiments.

Figure 1:
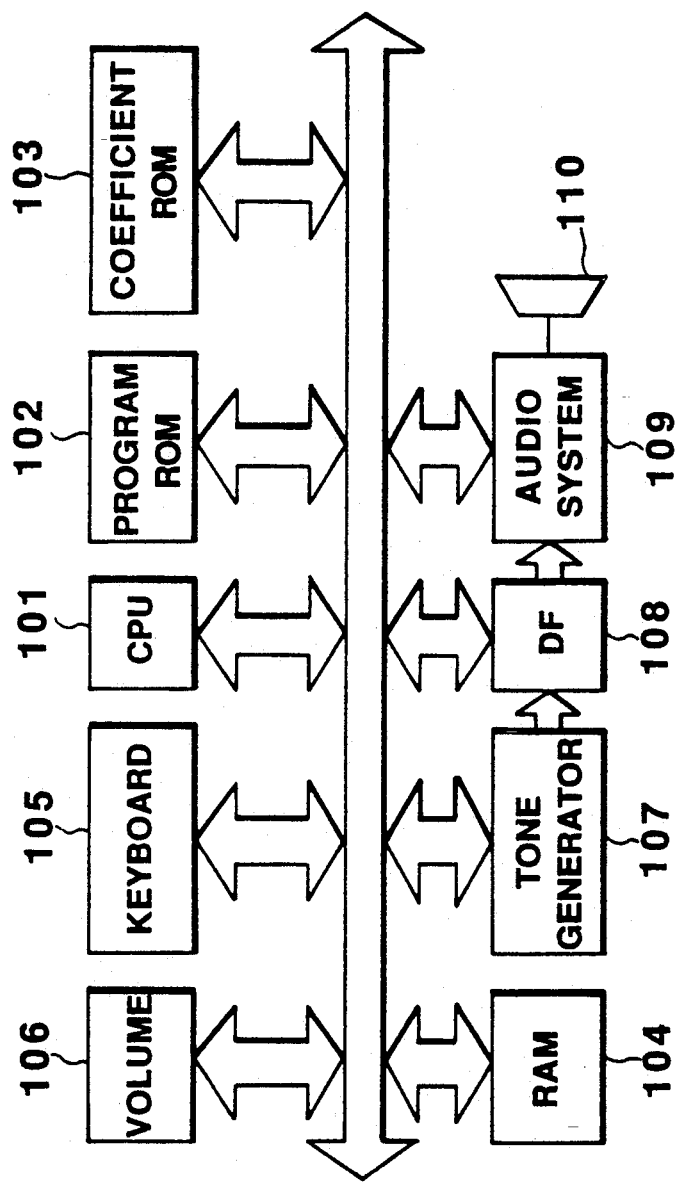
FIG. 1 is a block diagram of an electronic musical instrument incorporating a digital filter system in accordance with a first embodiment of the invention.

FIG. 1 shows an overall arrangement of an electronic musical instrument incorporating a digital filter system in accordance with a first embodiment of the invention. CPU 101 controls the entire system. Program ROM 102 stores program instructions executed by CPU 101. Coefficient ROM stores filter coefficients corresponding to each of a plurality of discrete cutoff frequencies. RAM 104 serves as a working memory for CPU 101. Keyboard 105 provides performance input to the musical instrument in a conventional manner. Volume 106 is used to variably input a desired cutoff frequency in an analog form which is digitized by a digital to analog converter not shown. Tone generator 107 generates a tone signal(s). Digital filter (DF) 108 filters the tone signal from the tone generator 107. The filtered tone signal is sounded out through an audio system 109 and a speaker 110.

In place of the volume 106 (manually operable means), an automatic function generator may be used which generates a time-varying function for the desired cutoff frequency.

Figure 2:
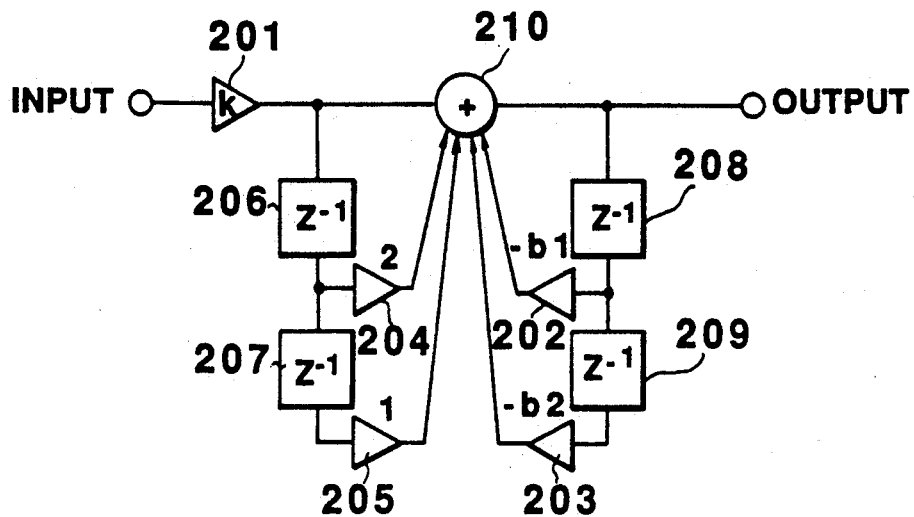
FIG. 2 is a block diagram of a second order IIR filter usable as the digital filter in FIG. 1.

By way of example, the digital filter 108 may take the form of a second order infinite impulse response (IIR) filter. FIG. 2 shows a logical arrangement of each IIR filter.

In FIG. 2, the digital filter comprises coefficient multipliers 201 to 205, one-sample delay elements 206 to 209 and an adder (summer) 210, coupled as shown. Certain filter coefficients vary depending on the cutoff frequency and they include; coefficient K of the multiplier 201 for multiplying an input signal (tone signal from the tone generator 107), coefficient b1 of the first order feed-back multiplier 202 and coefficient b2 of the second order feed-back multiplier 203. More specifically, as indicated in FIG. 2, these coefficients b1, b2 and K are given by:

$$b1 = 2(A^2 - 1)/(A^2 + 2aA + 1)$$

$$b2 = (A^2 - 2aA + 1)/(A^2 + 2aA + 1)$$

$$K = (1 + b1 + b2)/4$$

where for a Butterworth low pass filter, a and A are:

$$a = \cos 45°$$

$$A = \tan(fc\pi/fs)$$

where fc is the cutoff frequency and fs is the sampling frequency.

The transfer function H(z) of the digital filter in FIG. 2, which determines the relationship between the input and output signals, is expressed by:

$$H(z) = K(1 + 2z^{-1} + z^{-2})/(1 + b1z^{-1} + b2z^{-2})$$

Figure 3:
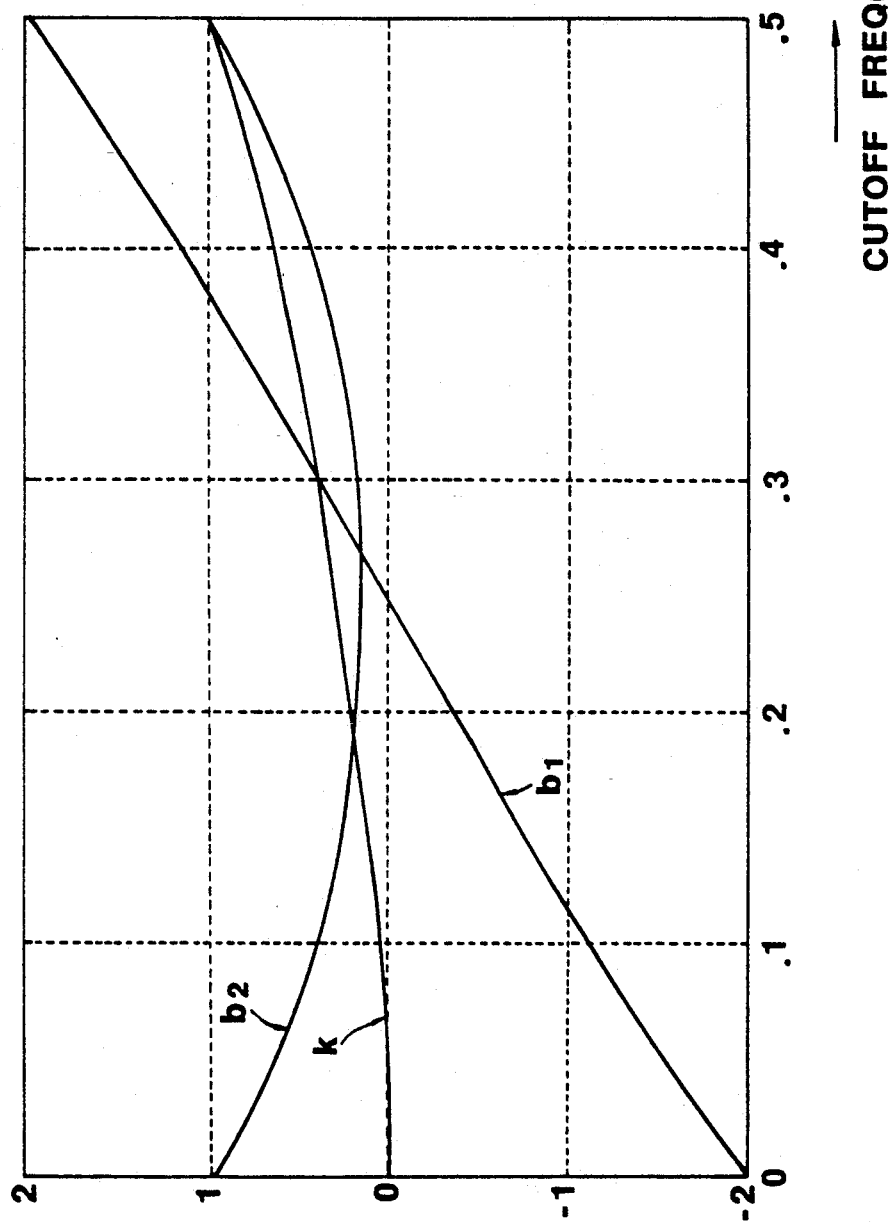
FIG. 3 illustrates how filter coefficients of the digital filter in FIG. 2 depend on the cutoff frequency.

FIG. 3 depicts the dependencies of coefficients b1, b2 and K on the cutoff frequency in the range of fc/fs = 0 to 0.5 according to the formula above. If the coefficients were stored for all possible values of the cutoff frequency commanded from the volume K, this would require an enormous storage capacity. In accordance with the invention, the coefficient ROM 103 is designed to store only those filter coefficients at (more) discrete cutoff frequencies. In addition, an interpolation technique is applied to obtain coefficients at a cutoff frequency between the stored discrete cutoff frequencies. Since coefficient K is easy to calculate from coefficients b1 and b2 as $K=(1+b1+b2)/4$, storage of only coefficients b1 and b2 in ROM 106 will suffice.

Figure 4:
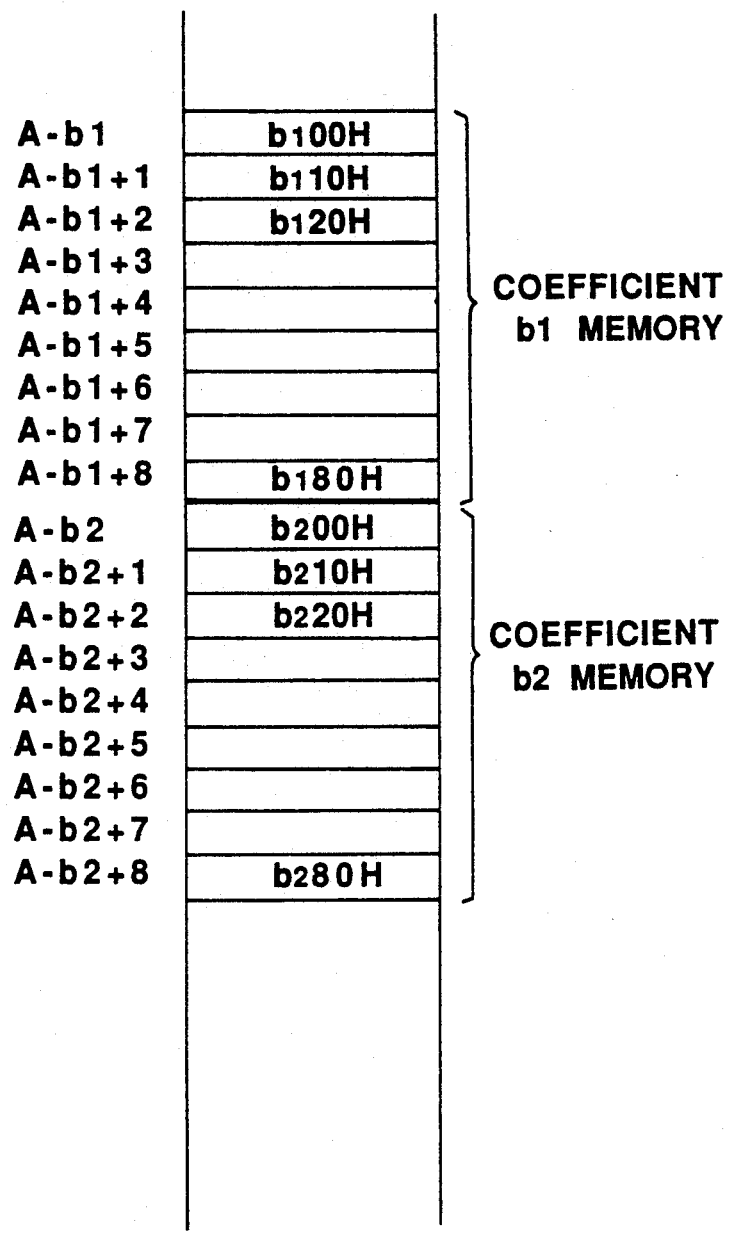
FIG. 4 shows a storage map of the coefficient ROM in FIG. 1.

FIG. 4 shows a storage allocation of the coefficient ROM 103 in the case of nine discrete cutoff frequency samples. (A-b1) represents the start address of b1 coefficient memory while (A-b2) denotes the start address of b2 coefficient memory. Let an analog to digital converter (not shown in FIG. 1) for digitizing the analog output from the volume indicative of a desired cutoff frequency have a quantizing resolution of eight bits so that all possible values of the (digitized) desired cutoff frequency range from 0 to 127, totalling 128 in number. Then, for nine discrete cutoff frequency samples, adjacent addresses of the coefficient ROM 103 have an equivalent spacing (frequency difference) which is sixteen times the quantized difference of the desired cutoff frequency. In FIG. 4, each stored coefficient symbol (b1, b2) is followed by a number which indicates a cutoff frequency value in hexadecimal notation. Thus "b110H", for example, means a coefficient b1 at a cutoff frequency value of 10H. Therefore, the highest four bits of an 8-bit desired cutoff frequency supplied from the volume 106 through the analog to digital converter constitute an integer part that determines a relative address of each coefficient memory while the lowest four bits indicate a fractional part.

Figure 5:
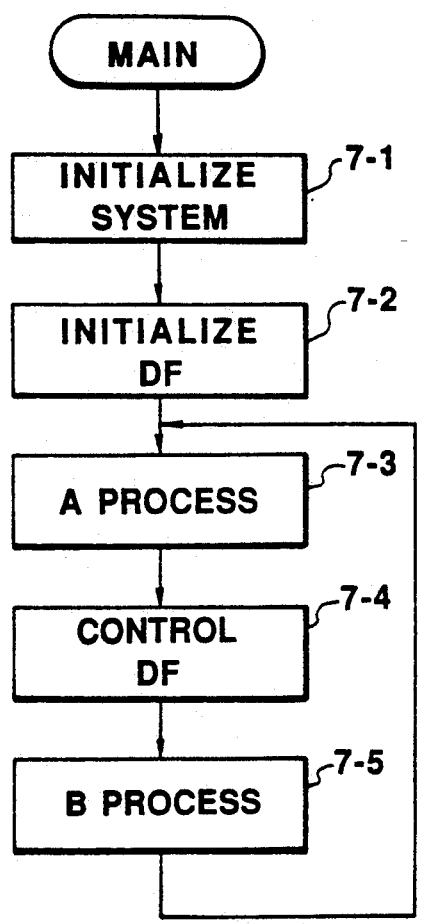
FIG. 5 is a flow chart of the main routine of CPU in FIG. 1.

FIG. 5 shows a main flow of CPU 101. Upon power-on, CPU 101 initializes the system (7-1) and the digital filter (DF) 108 (7-2). After the initialization CPU 101 repeatedly executes the main loop (7-3 to 7-5). The main loop includes Control DF routine 7-4 as well as other processes 7-3 and 7-5 required for the musical instrument.

Figure 6:
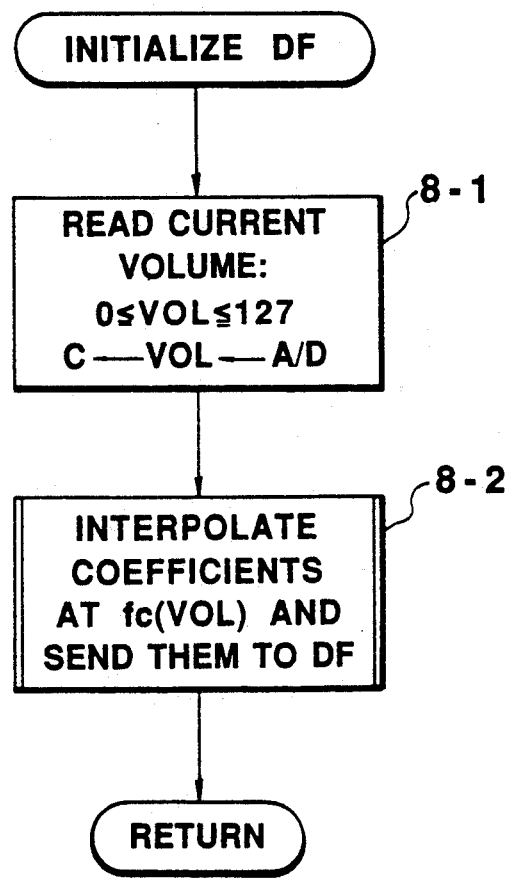
FIG. 6 is a flow chart of the Initialize DF routine in FIG. 5.

FIG. 6 shows a flow chart of the Initialize DF routine 7-2. This routine first reads from the volume 106 a (digitized) value of the desired cutoff frequency at the power-on time, as VOL in the range of 0 to 127, and loads VOL into C register for initialization (8-1). C register serves as goal or reference storage means for storing a goal or reference value of operative cutoff frequency of the digital filter 108. Then, block 8-2 interpolates (calculates) filter coefficients at the value C of the cutoff frequency fc, using the coefficient ROM 103 in a manner to be described later in accordance with a flow chart of FIG. 8, and transfers the interpolated coefficients as current filter coefficients to the digital filter 108.

Figure 7:
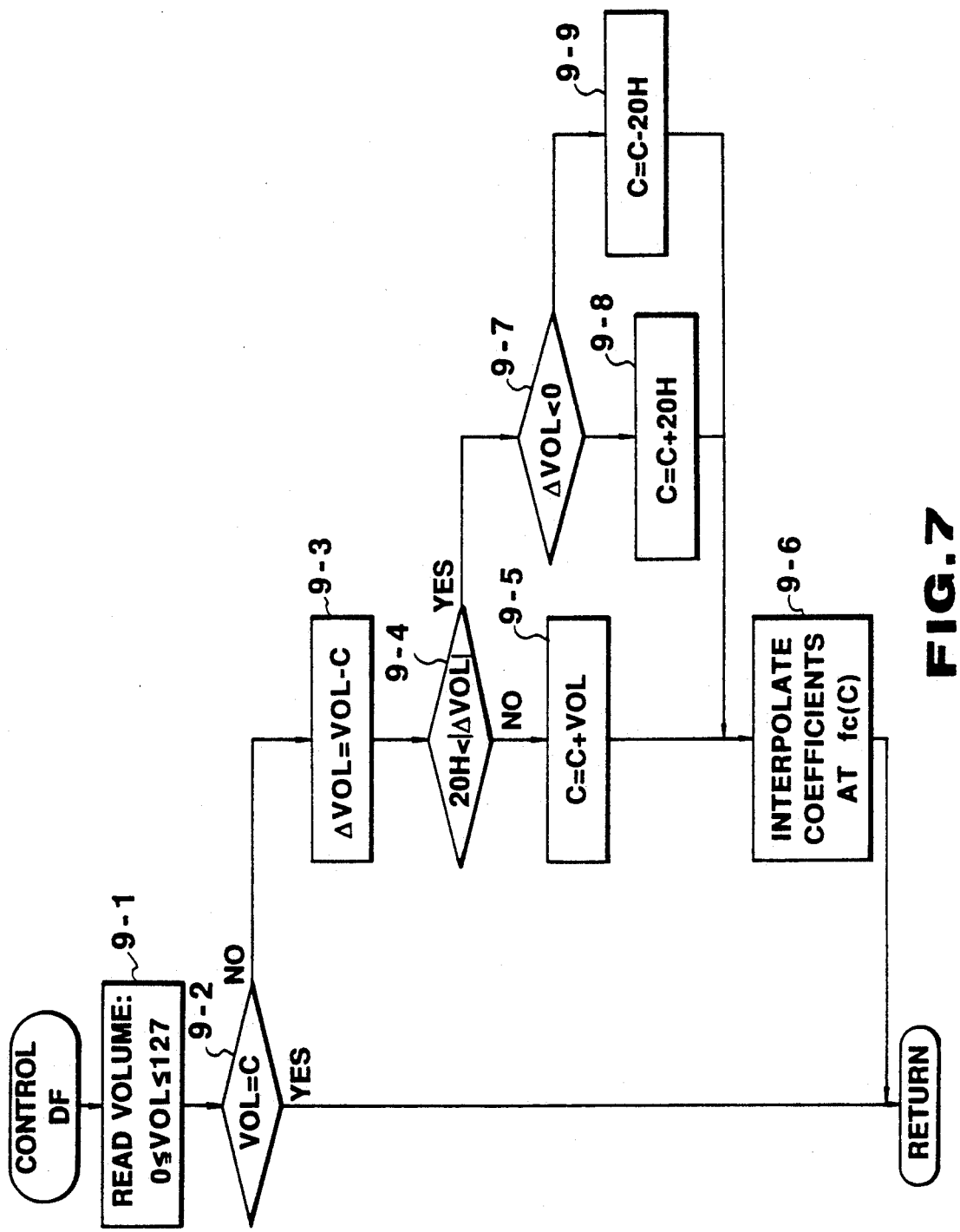
FIG. 7 is a flow chart of the Control DF routine in FIG. 5.

FIG. 7 shows a detailed flow chart of Control DF routine 7-4. The function of this routine is to calculate a new goal (subgoal) of the cutoff frequency in response to a new value of the desired cutoff frequency from the volume 106 and to obtain filter coefficients at the new goal of the cutoff frequency.

To this end, Control DF routine first executes block 9-1 to read a new value VOL of the desired cutoff frequency from the volume 106. If the new value VOL is equal to the reference value (old goal) C of the operative cutoff frequency (9-2), Control DF routine directly terminates because there is no need for updating the goal (i.e., creating a new goal) of the operative cutoff frequency. If VOL differs from C, block 9-3 measures the difference $\Delta$VOL by subtracting the old goal C from the new desired cutoff frequency VOL. Block 9-4 compares the absolute value $|\Delta VOL|$ of the difference with a predetermined value 20H. This value 20H corresponds to address distance of 2 in the coefficient ROM 103 in FIG. 4, and indicates a relatively small difference of cutoff frequency.

If the new value VOL of the desired cutoff frequency is sufficiently close to the old goal C ($20H \geq |\Delta VOL|$), Control DF routine executes block 9-5 to update the goal C equal to the new value VOL from the volume 106.

On the other hand, if the new desired cutoff frequency VOL differs from the old goal C by more than the predetermined value 20H, Control DF routine creates a new goal (subgoal) of the cutoff frequency that is not equal to the new (and greatly changed) desired cutoff frequency but is located between the old goal value C and the new desired value VOL. To this end, block 9-7 checks the sign of the difference $\Delta$VOL to see which one of the old goal value C and new desired value VOL is larger than the other. Depending on the sign, either block 9-8 or 9-9 is executed to create a new goal C of cutoff frequency by changing the old goal C by 20H in such a manner that the new goal is directed toward the new value VOL of the desired cutoff frequency.

Interpolate Coefficients routine or block 9-6 uses the new goal (updated goal) C of cutoff frequency from blocks 9-5, 9-7 or 9-9 to interpolate filter coefficients at the new goal C of cutoff frequency.

Figure 8:
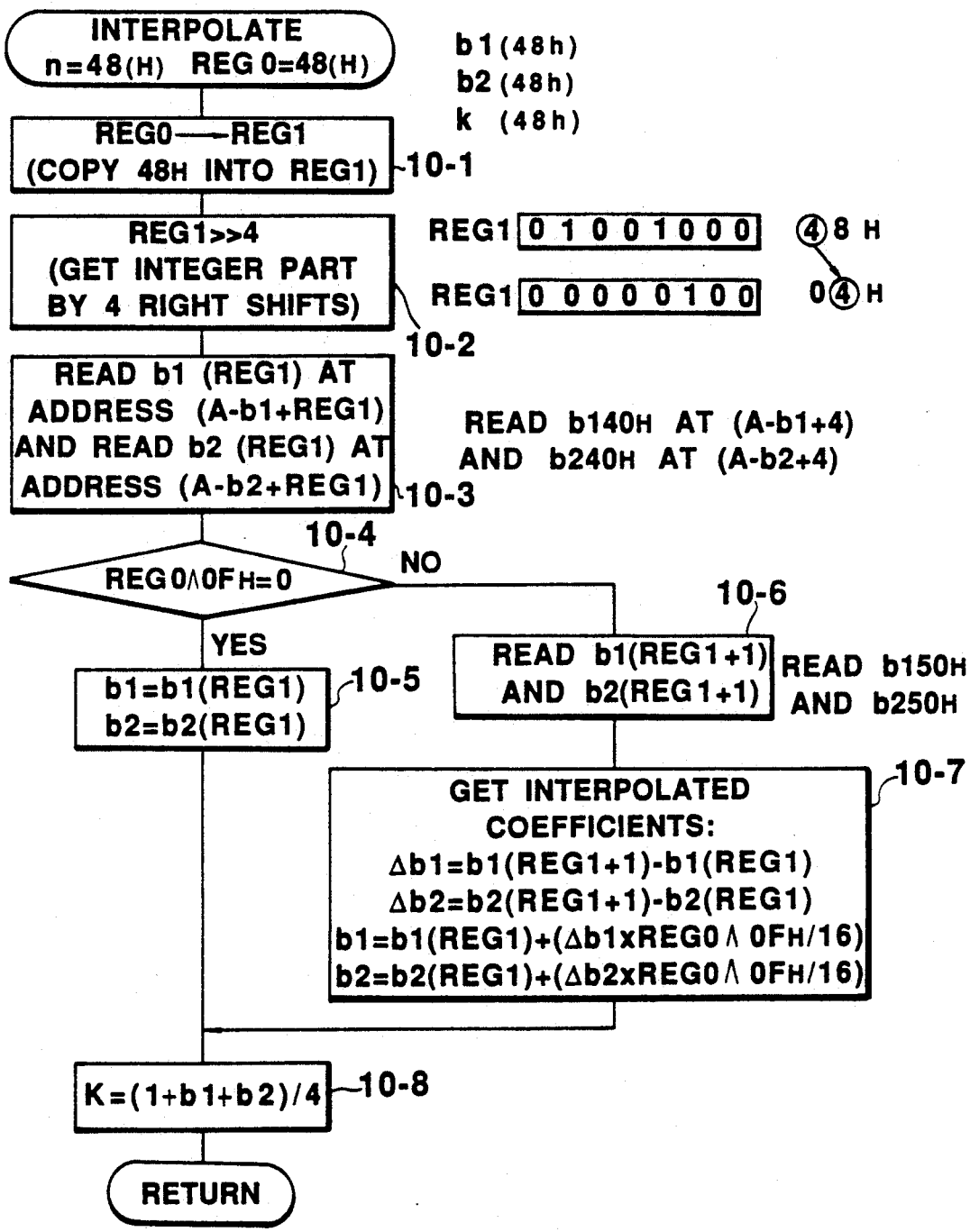
FIG. 8 is a flow chart of the Interpolate Coefficients routine.

FIG. 8 shows a detailed flow chart of the Interpolate Coefficients routine 9-6. In brief, this routine interpolates filter coefficients at the new goal value of digital filter cutoff frequency based on or as a function of those filter coefficients stored in the coefficient ROM 103 and near the new goal of the cutoff frequency. In the case of FIG. 8, each filter coefficient at the new goal of cutoff frequency is linearly interpolated by calculating a linear function of a pair of stored coefficients at adjacent discrete cutoff frequencies nearest to the new goal value of the cutoff frequency.

More specifically the illustrated Interpolated routine first executes block 10-1 to copy or move the new goal of cutoff frequency represented by 8 bits from REG0 register to REG1 register. The next block 10-2 gets an integer part of the new goal by shifting right the contents of REG1 by four digits. For example, 04H is obtained from the new goal value of 48H. The integer part determines a relative address of each coefficient memory where a filter coefficient at a discrete cutoff frequency corresponding to the integer part is stored. Thus, the block 10-3 reads from b1 and b2 coefficient memories a b1 coefficient at address (A−b1+REG1), denoted by b1(REG1), and a b2 coefficient at address (A−b2+REG1), denoted by b2(REG1).

Block 10-4 checks a fractional part of the new goal frequency by logically ANDing REG0 and 0FH. If the fractional part is zero, the new goal value of the cutoff frequency is a whole number. Thus, the block 10-5 sets b1 and b2 registers to b1(REG1) and b2(REG1) respectively. In this way b1 register stores a b1 coefficient at the new goal of the cutoff frequency while b2 register stores a b2 coefficient at the new goal.

If the new goal of cutoff frequency has a nonzero fractional part, block 10-6 reads from the coefficient memories another b1 coefficient denoted b1(REG1+1), and nother b2 coefficient, denoted b2(REG1+1), stored at the respective next address to the one pointed to by the integer part of the new goal value. In other words, b1(REG1) and b1(REG1+1) are stored b1 coefficients at adjacent discrete cutoff frequencies between which the new goal of the cutoff frequency is located. Similarly, b2(REG1) and b2(REG1+1) are stored b2 coefficients at the adjacent discrete cutoff frequencies. The interpolating block 10-7 calculates the respective difference $\Delta b1$, $\Delta b2$ between the two adjacent filter coefficients, as:

$$\Delta b1 = b1(REG1+1) - b1(REG1), \text{ and}$$

$$\Delta b2 = b2(REG1+1) - b2(REG1)$$

Using these differences $\Delta b1$ and $\Delta b2$, and the fractional part (REG0A0FH) of the new goal value of cutoff frequency, the block 10-7 linearly interpolates b1 and b2 coefficients at the new goal value by:

$$b1 = b1(REG1) + (\Delta b1 \times (REG0A0FH))/16),$$

$$b2 = b2(REG1) + (\Delta b2 \times (REG0A0FH))/16).$$

Finally, the block 10-8 calculates K coefficient at the new goal of cutoff frequency from the interpolated coefficients b1 and b2 by:

$$K = (1 + b1 + b2)/4$$

The fraction checks block 10-4 may be omitted together with blocks 10-5 by executing blocks 10-6 and 10-7 after executing the block 10-3.

In summary, Control DF routine (FIG. 7) can control the digital filter 108 without deteriorating its characteristics. Even if the desired cutoff frequency input from the volume 106 is greatly changed, the Control DF routine repeatedly operates in the main loop (see FIG. 5) to produce a succession of subgoals of digital filter cutoff frequency that progressively approaches the changed desired cutoff frequency. The difference between successive subgoals is only a small one. Each time when it creates a new subgoal of cutoff frequency, Control DF routine interpolates filter coefficients at the new subgoal, using stored filter coefficients in coefficient ROM 103.

Figure 9:
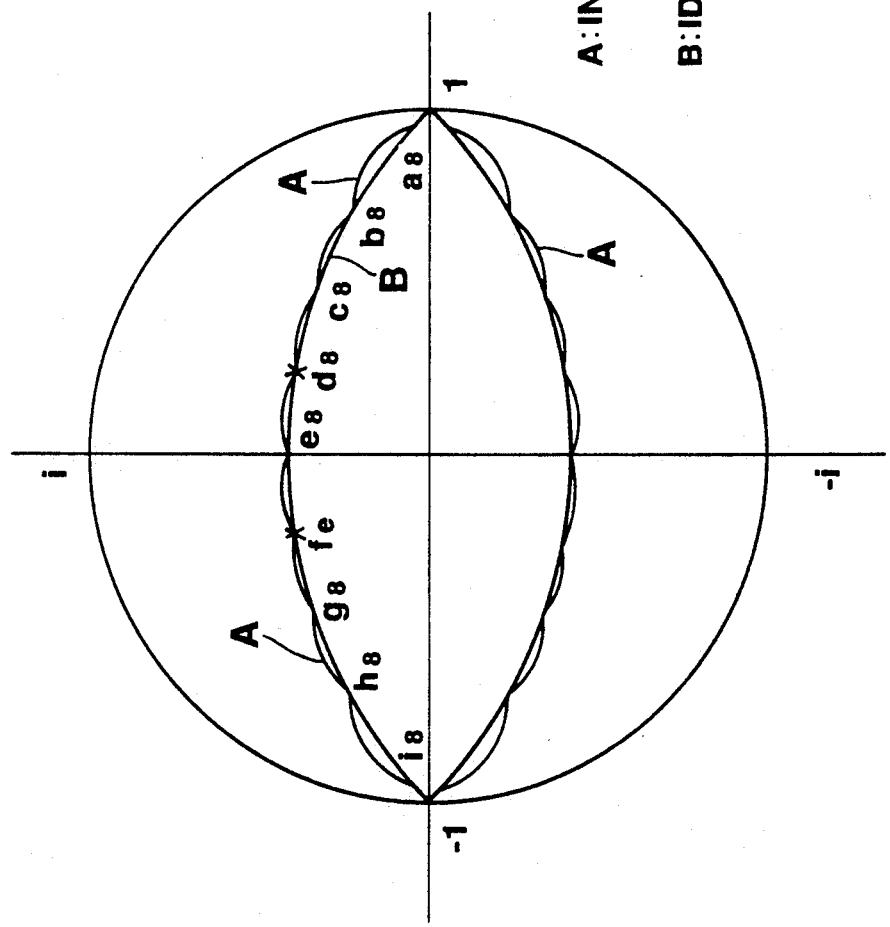
FIG. 9 shows an interpolated pole movement on a z plane starting with nine samples of the filter coefficient set together with an ideal pole movement.
Figure 10:
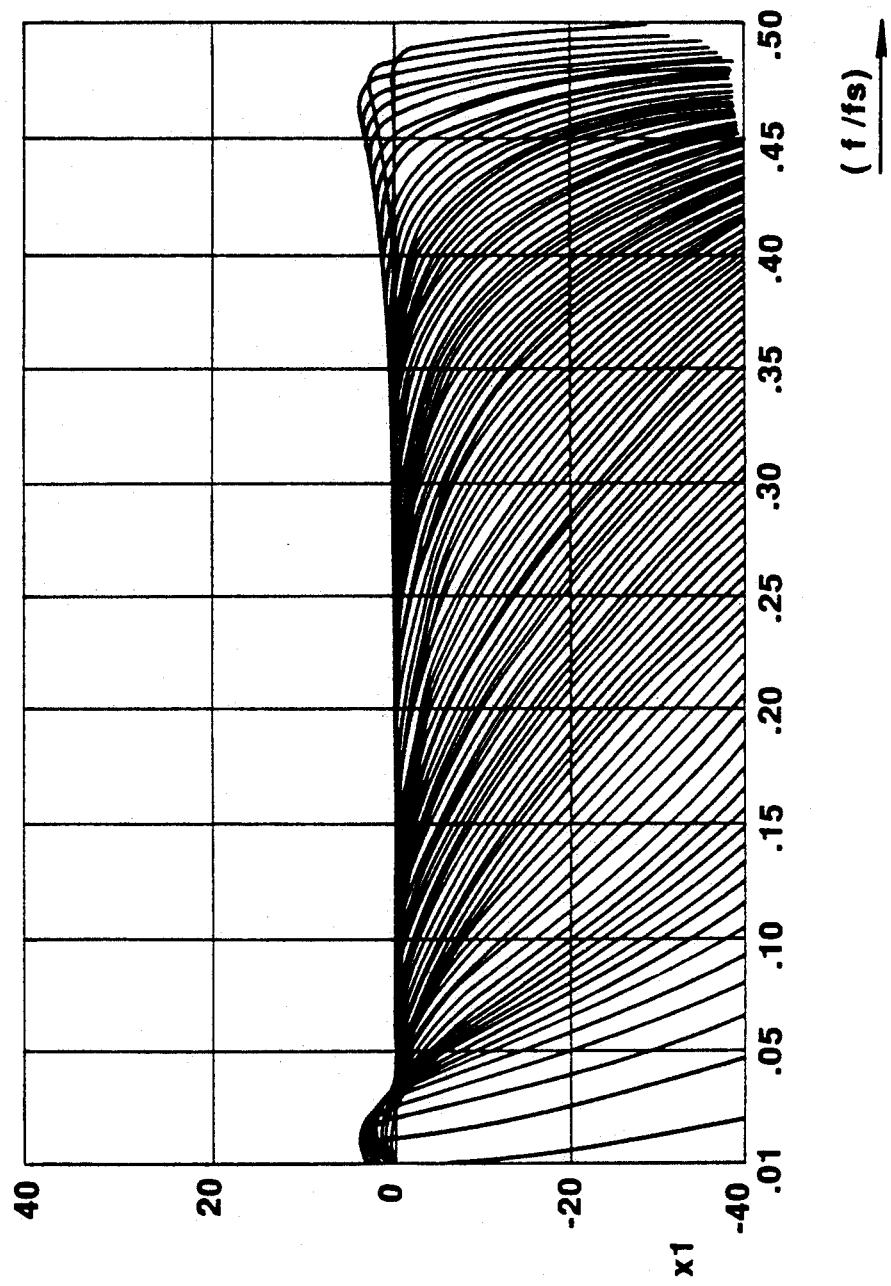
FIG. 10 shows frequency spectral characteristics for various cutoff frequencies, obtained at corresponding interpolated pole locations in FIG. 9.
Figure 11:
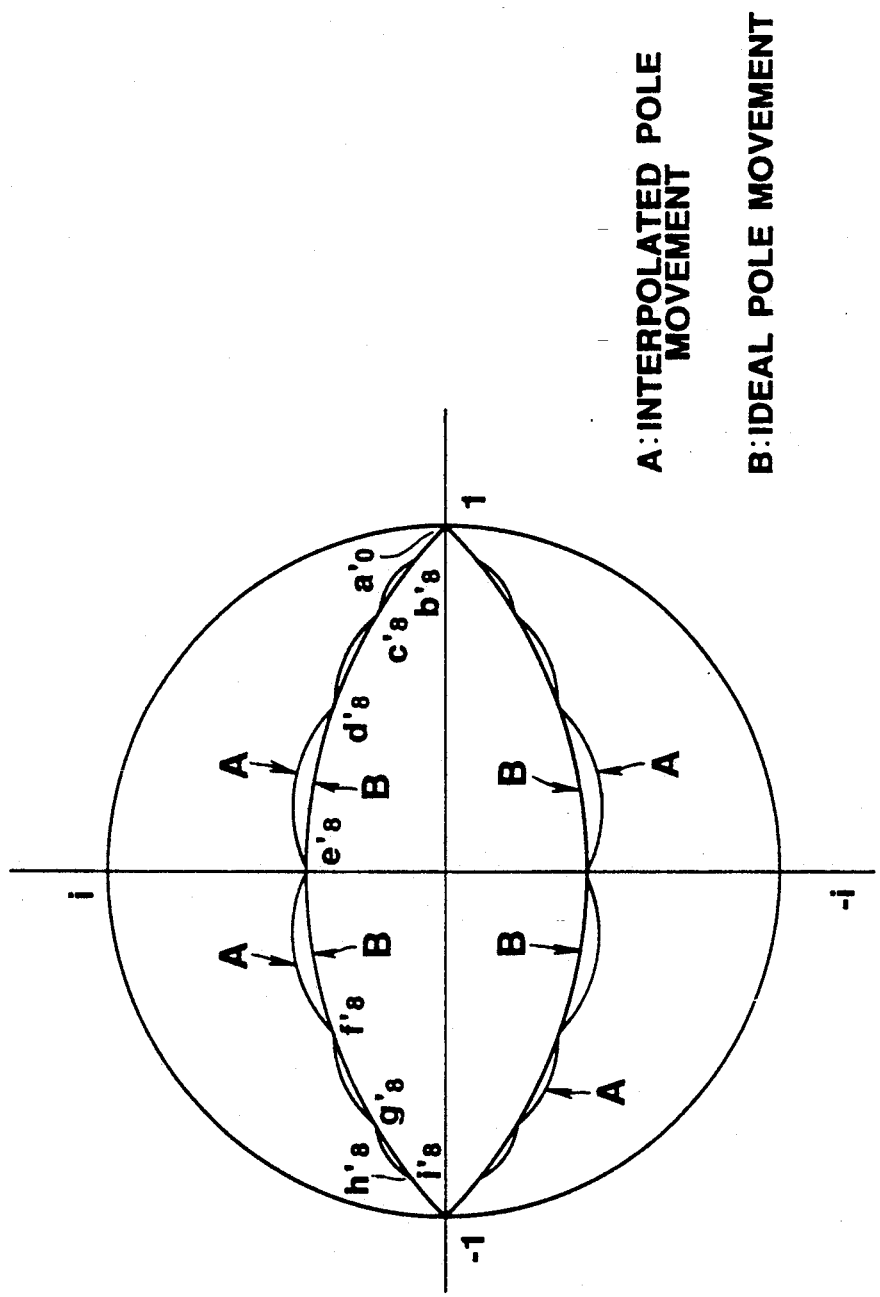
FIGS. 11 and 12 show further examples of the interpolated pole movement.

FIGS. 9 to 11 depict evaluations of the interpolated results obtained from the process shown in FIG. 8. In particular, FIG. 9 shows pole movements (pole loci) on Z plane of the second order IIR digital low pass filter in FIG. 2. Curve B is a pole movement obtained with an ideal filter of Butterworth type that uses direct calculations of b1, b2 and K coefficients according to the formula indicated in FIG. 2. Curve B is an interpolated pole movement obtained with linear interpolated coefficients resulting from the process of FIG. 8, starting with nine stored samples in the coefficient ROM 103. Nine pole points corresponding to the nine discrete cutoff frequency samples are indicated in FIG. 9 by a8 to i8 with their fc/fs ratios ranging from 0.01 to 0.49. In particular, fc/fs ratio of pole point a8 is 0.01, that of b8 is 0.07 and so on with the leftmost pole point i8 having fc/fs of 0.49. Interpolating between each two adjacent pole samples results in the curve A. The interpolated pole locus A moves outward of the ideal pole locus B.

FIG. 10 shows frequency spectra for various cutoff frequencies corresponding to various interpolated pole points on the curve A in FIG. 9. A resonance appears for fc/fs ratios between 0.01 and 0.07 or equivalently between pole points a8 and b8 in FIG. 9 and for fc/fs ratios between 0.43 and 0.49 or equivalently between pole points h8 and i8. As seen in FIG. 9, in the middle of a8-b8 segment, and in the middle of h8-i8 segment, the interpolated curve A is most remote from the ideal curve B.

However, such error or resonance can be reduced to a satisfactory degree for practical applications. FIG. 9 shows a case of nine cutoff frequencies merely because of clarity of drawing illustration. If the difference between discrete cutoff frequency samples is reduced to say, 100 cents, a satisfactory interpolation does result for a listener.

Figure 12:
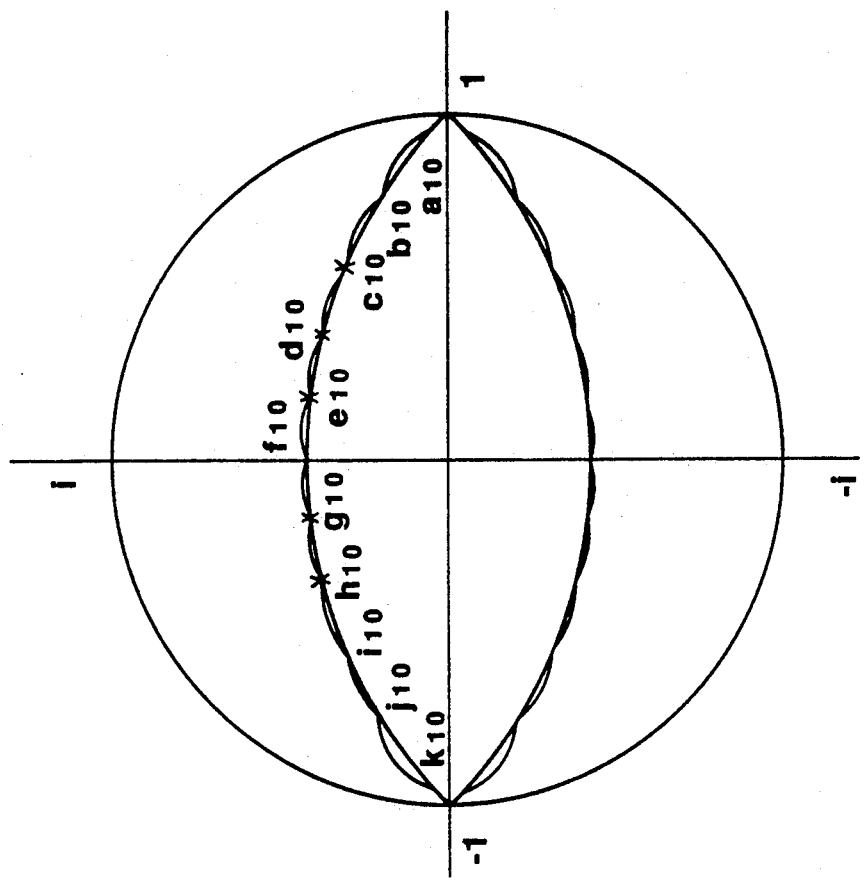

FIGS. 11 and 12 shows further examples of interpolated pole movement: FIG. 11 is another 9-sample case and FIG. 12 is an 11-sample case.

In FIG. 11, the nine pole samples are located with a smaller spacing near the unit circle and a larger spacing as the pole goes away from the unit circle. This is an efficient allocation of pole or cutoff frequency samples because a degree of influence on the filter characteristics such as frequency spectrum by the interpolation error is most significant on or near the unit circle.

In addition to the background program shown in FIG. 5, the program ROM 102 stores a time interrupt routine which is periodically executed by CPU 101 per 5 milliseconds. The time interrupt routine references filter coefficients b1, b2 and K from Control DF routine 7-4 (FIG. 7) in the main loop of the background program to calculate changing rates of the coefficients and send them to the digital filter 108 together with the filter coefficients.

Figure 13:
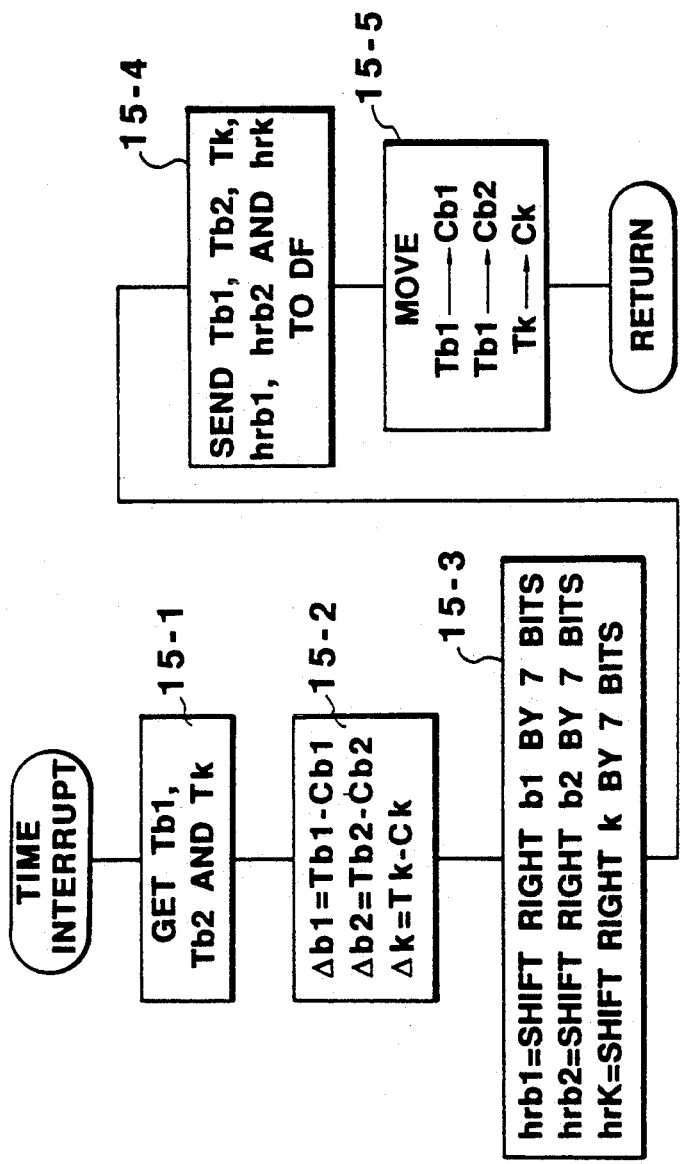
FIG. 13 is a flow chart of a time interrupt routine of the CPU in FIG. 1.

FIG. 13 shows a flow chart of the time interrupt routine. Block 15-1 gets b1, b2 and K coefficients (here denoted by Tb1, Tb2 and TK) from the Control DF routine. These coefficient values Tb1, Tb2 and TK indicate a new goal (subgoal) of the coefficients where the digital filter 108 will reach. Block 15-2 calculates respective differences $\Delta b1$, $\Delta b2$ and $\Delta K$ between the new goal of the coefficients Tb1, Tb2 and TK, and the current value of the coefficients Cb1, Cb2 and CK as:

$$\Delta b1 = Tb1 - Cb1$$

$$\Delta b2 = Tb2 - Cb2$$

$$\Delta K = TK - CK$$

Block 15-3 calculates a predetermined fraction of each difference $\Delta b1$, $\Delta b2$ and $\Delta K$ to obtain a changing (interpolating) rate of each coefficient, denoted hrb1, hrb2 and hrK. Let, here, 32 microseconds be the interpolation period of the digital filter 108 interpolator which updates or changes the operative filter coefficients of the digital filter by the changing rates. Then, for a 5 millisecond period of parameter transfer from CPU 101 the digital filter 108 interpolator can update the operative filter coefficients up to 156 times. Considering a margin, if 1/128 is chosen as the fraction above, the operative coefficients of the digital filter 108 will reach the subgoal before a new subgoal of the coefficients is supplied from CPU 101. Thus, the block 15-3 shifts right $\Delta b1$, $\Delta b2$ and $\Delta K$ by 7 bits, which is equivalent to multiplying $\Delta b1$, $\Delta b2$ and $\Delta K$ by 1/128, to obtain coefficient changing rates hrb1, hrb2 and hrK. Block 15-4 send the digital filter 108 a new set of parameters comprising Tb1, Tb2, TK, hrb1, hrb2, and hrK. Finally block 15-5 moves Tb1, Tb2 and TK to current registers Cb1, Cb2 and CK, respectively.

Figure 14:
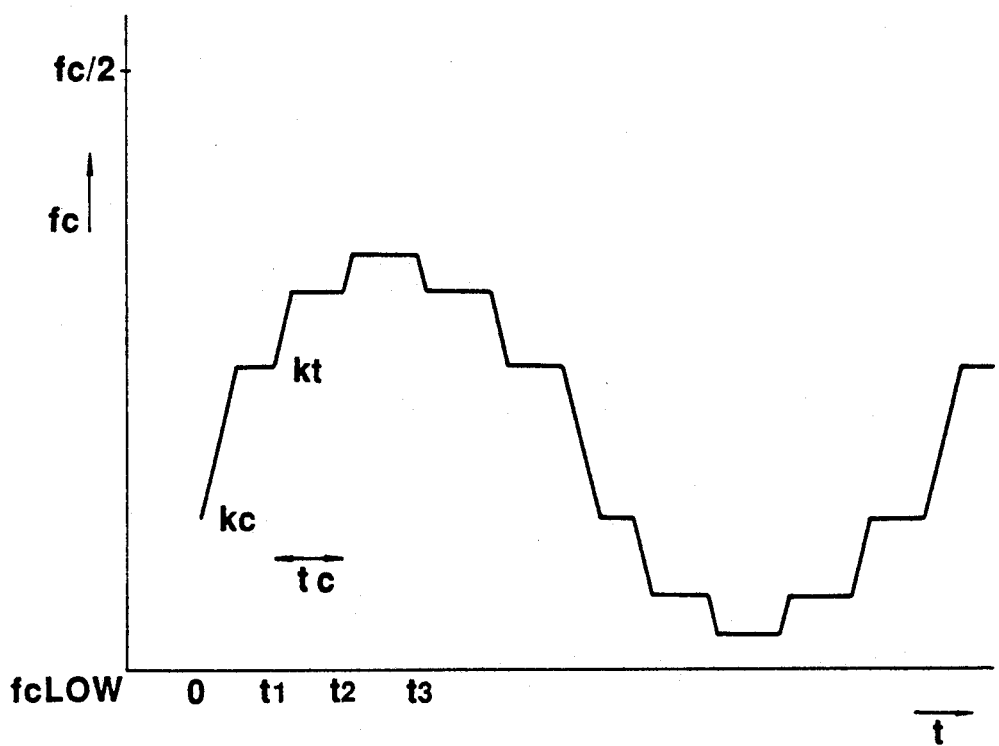
FIG. 14 is a graphic representation of how the operative cutoff frequency of the digital filter varies with time, obtained when using fixed changing rates of coefficients.
Figure 15:
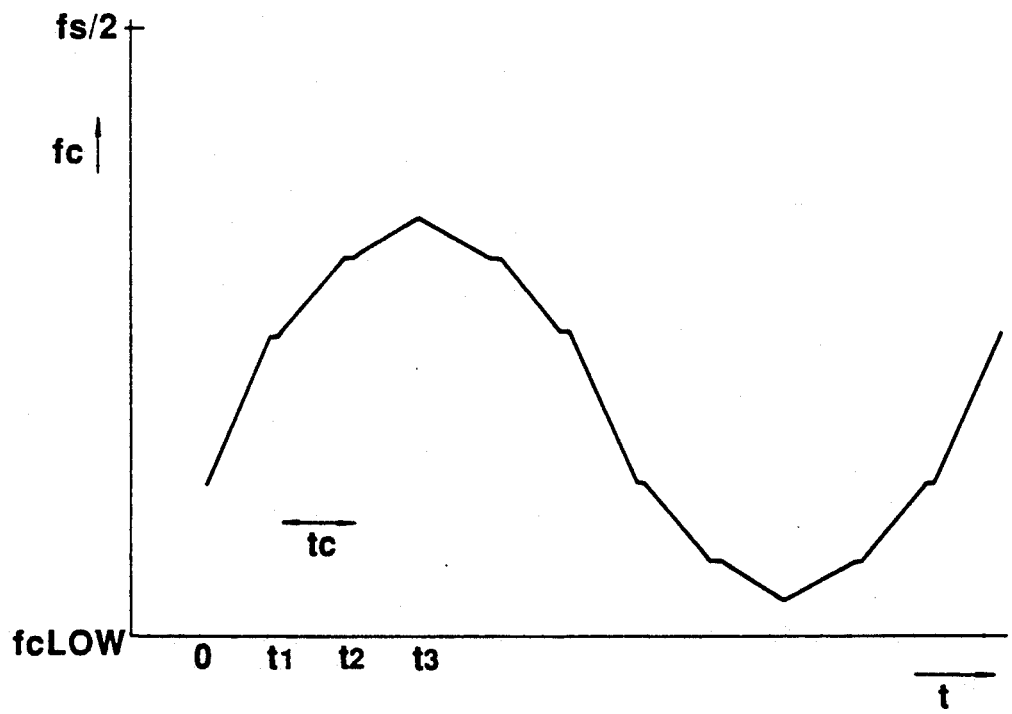
FIG. 15 is a graphic representation of how the operative cutoff frequency of the digital filter varies with time, obtained when using variable changing rates of coefficients in accordance with the invention.

FIGS. 14 and 15 show how the cutoff frequency of the digital filter changes with time. FIG. 14 is the case in which a fixed changing rate (differential value) of each coefficient is supplied to the digital filter from CPU 101 per each 5 milliseconds. In the case of FIG. 15, a changing rate of each coefficient supplied from CPU 101 is variable in proportion to the difference between the old and new subgoals of the coefficient. Such variable changing rate is obtained in accordance with the flow chart of FIG. 13. With a fixed changing rate, the time required for the digital filter to reach a new subgoal of the cutoff frequency varies depending on the difference between the old and new subgoals. Thus, the operative cutoff frequency v.s. time profile takes the form of a staircase as shown in FIG. 14. This results in an unsmooth variation in the characteristics of the tone signal filtered through the digital filter 108. In contrast, DF control using variable coefficient changing rates in proportion to intersubgoal difference provides a smooth variation in the operative cutoff frequency of the digital filter 108, as shown in FIG. 15, because the time for the digital filter 108 to move from one subgoal to another is kept essentially constant.

It is preferred that the desired cutoff frequency from the volume 100 is represented by value in proportion to cent. It is also preferred to allocate filter coefficients in ROM 103 the cutoff frequency of which is proportional to cent in order to facilitate addressing the coefficient ROM 103.

Figure 16:
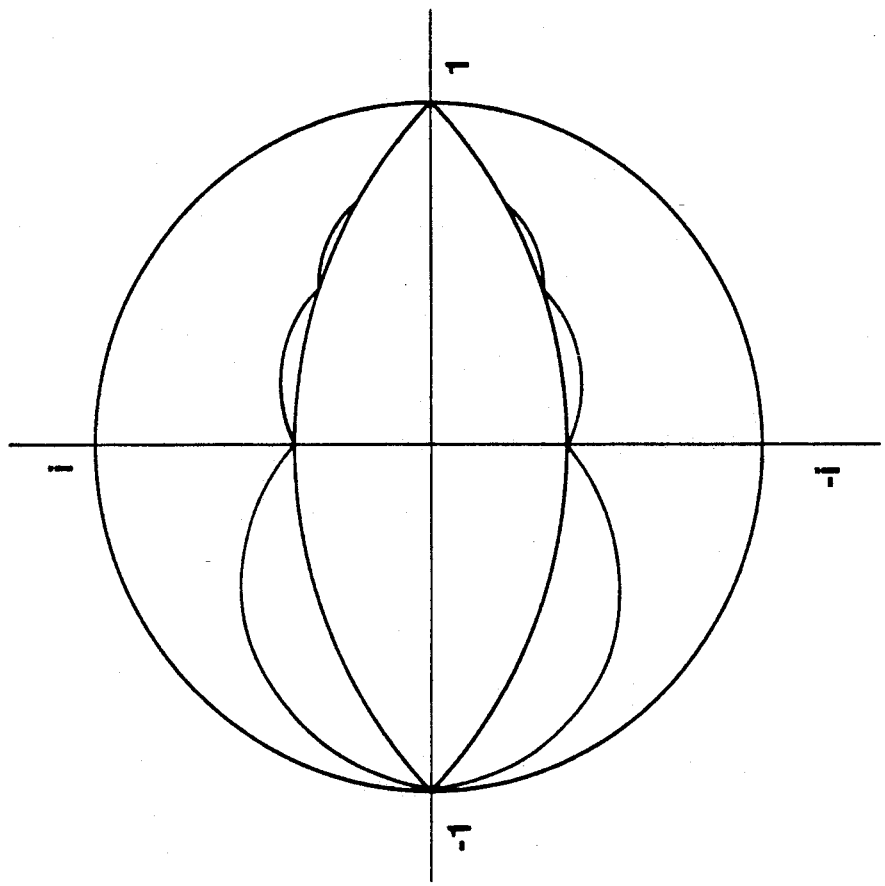
FIG. 16 shows still another example of the interpolated pole movement.

FIG. 16 shows nine cutoff frequency samples chosen in proportion to cent together with the interpolated pole movement obtained from the samples.

Figure 17:
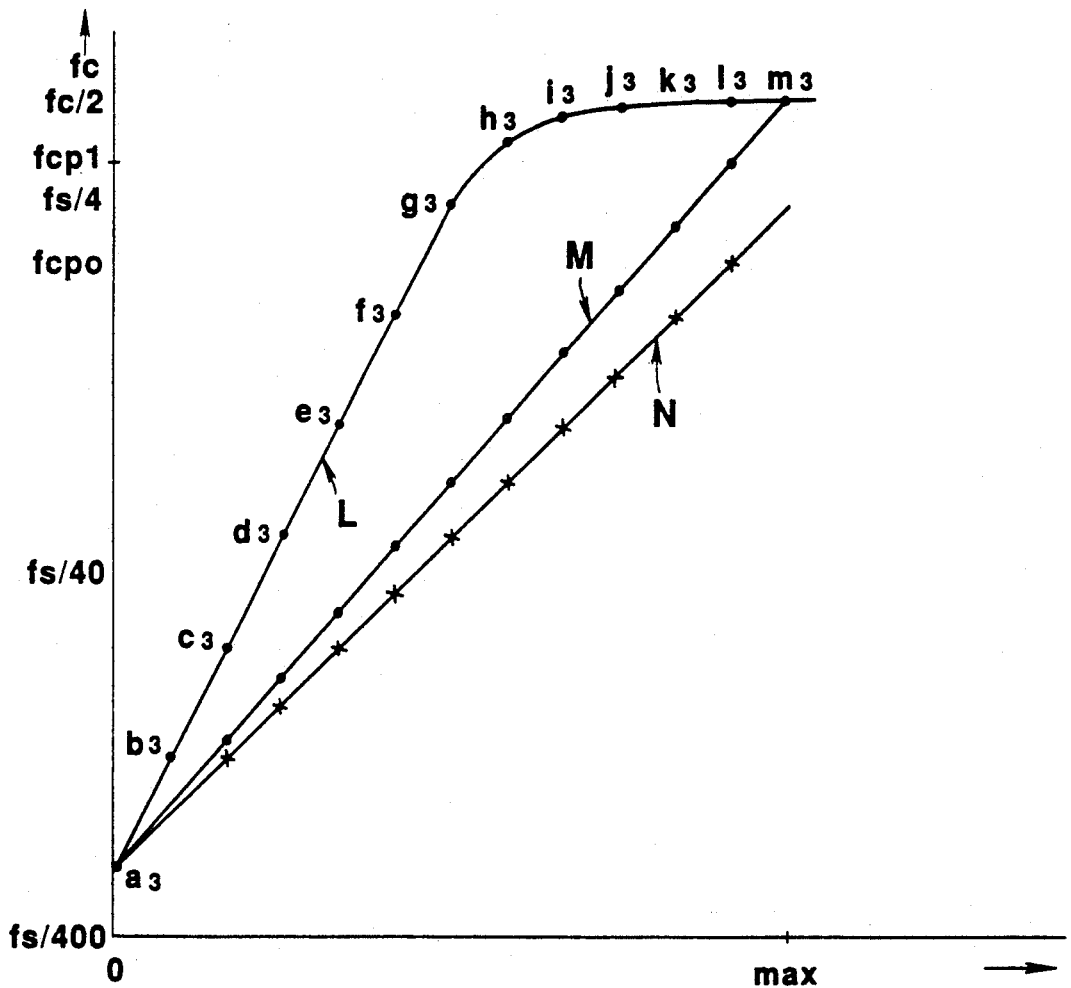
FIG. 17 is a graphic representation illustrating relationships between coefficient ROM address and cutoff frequency.

FIG. 17 shows three different relationships between ROM 103 address and cutoff frequency. Lines M and N are examples in which cutoff frequencies assigned to addresses are directly proportional to cent (i.e., the cutoff frequency difference between adjacent addresses is a pretermined number of cents). Curve L is obtained when those cutoff frequencies which minimize the interpolation error are assigned to the coefficient ROM addresses.

Using the cent-proportional scheme, as depicted in lines M and N, it becomes easier to calculate from the desired cutoff frequency the coefficient ROM address that stores a filter coefficient at or near the desired cutoff frequency commanded from the volume 106. In addition, the cent-proportional scheme provides a linear relationship between amount of manipulation of a manipulator such as volume 106, and desired cutoff frequency, which relationship is linearly perceived or heard. Accordingly it becomes easier for the user to command any desired cutoff frequency.

Description now turns to a digital filter system in accordance with a second embodiment of the invention.

Figure 18:
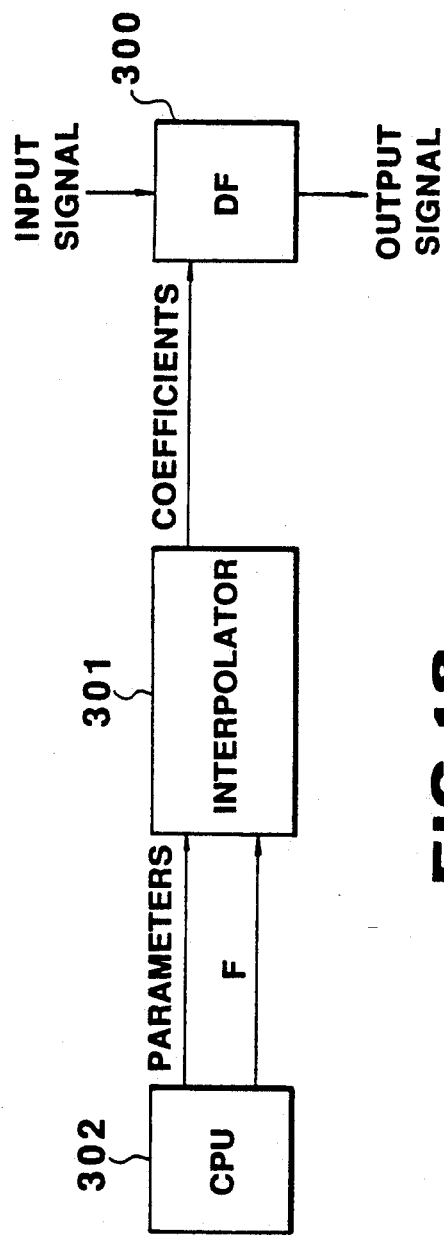
FIG. 18 is a block diagram illustrating a basic arrangement of a digital filter system including an interpolator in accordance with a second embodiment of the invention.
Figure 19:
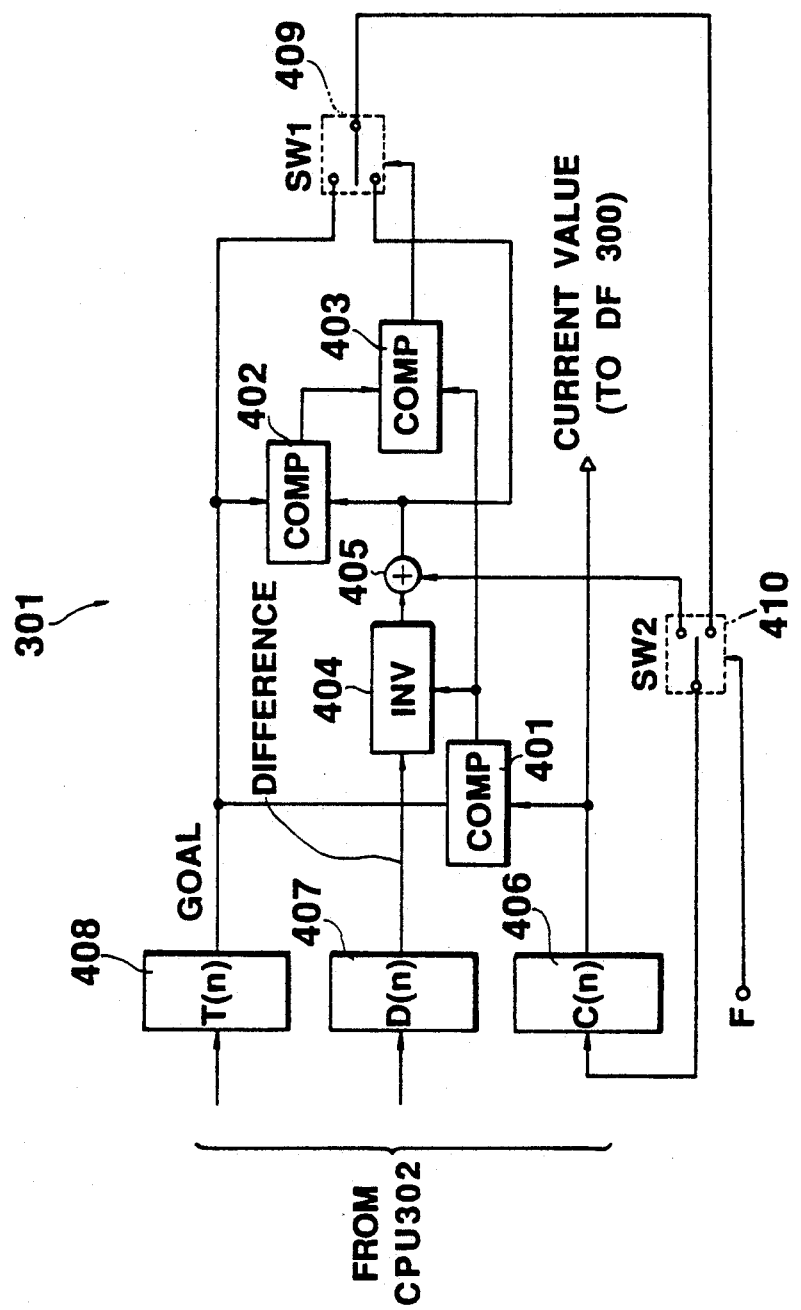
FIG. 19 is a block diagram of a basic arrangement of the interpolator in FIG. 18.

FIG. 18 is a block diagram illustrating the main portion of the second embodiment. FIG. 19 shows a basic arrangement of the interpolator 301 in FIG. 18.

The illustrated digital filter system, which may be applied to an electronic musical instrument, basically comprises a digital filter 300, CPU 302 and an interpolator 301. The digital filter 300 may be either a single or multiple signal processing digital filter. CPU 302 defines control means for controlling the digital filter. The interpolator 301 provides an interface between CPU 302 and the digital filter. CPU 302 operates asynchronous with the digital filter 300. In particular, CPU 302 repeatedly produces and supplies a set of parameters including filter coefficients and their changing rates (differential values) at a relatively slow sampling rate. The digital filter 300 produces filtered signal output samples at a relatively high sampling rate which must be kept constant for certain applications.

Further, in the application of digital tone signal processing, the allowable change in the operative filter coefficients actually used in the digital filter from one sampling cycle to another must be small to preserve the tone quality. Therefore, there must be provided means which smoothly changes the operative filter coefficients of the digital filter from the old to the new set of filter coefficients supplied from CPU over a number of sampling cycles of the digital filter. It is the interpolator that achieves this function.

Figure 20:
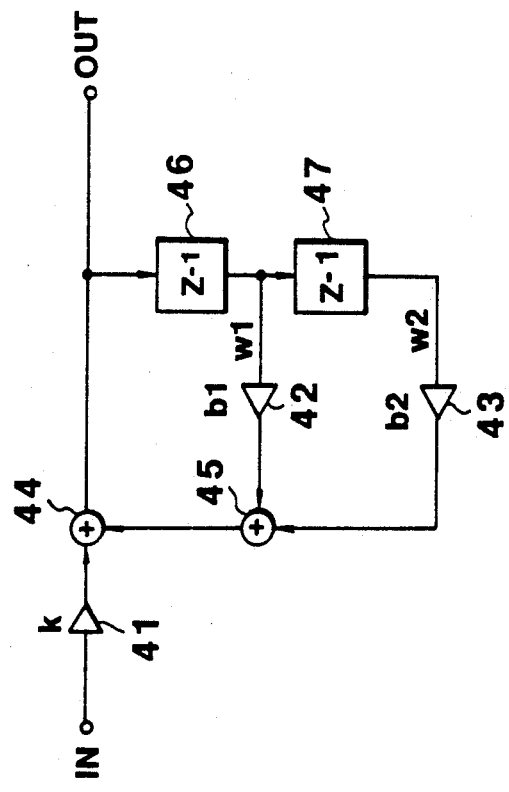
FIG. 20 is a block diagram of a second order IIR filter usable as the digital filter in FIG. 18.

The interpolator 301 is designed to produce, on a time divisional multiplexing basis, a plurality of interpolated (operative) filter coefficients based on the set of parameters from CPU 302 per each sampling cycle of the digital filter for each signal to be processed. For example, if a second order infinite impulse response (IIR) filter shown in FIG. 20 is chosen as (each channel of) the digital filter 300, the interpolator 301 produces three filter coefficients b1, b2 and K for each signal per each filter sampling cycle. To produce these operative filter coefficients, the interpolator 301 uses the set of parameters supplied from CPU 301. The set of parameters comprises current value of the respective coefficients, denoted $C(n)$ in FIG. 19, differential value of the coefficients, denoted $D(n)$ and, goal value of the coefficients, denoted $T(n)$.

In FIG. 19, memories 406 to 408 are provided to respectively store current value $C(n)$, differential value $D(n)$ and goal value $T(n)$, of each filter coefficient. For interpolation, a comparator 401 compares a current value $C(n)$ with a goal value $T(n)$ for each filter coefficient. The comparison result from the comparator 401 is supplied to an inverter selector 404 and second comparator 403. The inverter selector 404 inverts the differential value $D(n)$ when $T(n)<C(n)$. The comparator 403 determines whether the current value $C(n)$ has reached the goal $T(n)$. An adder 405 adds the current value $C(n)$ and the output from the inverter selector 404 indicative of a selectively inverted differential value to change (update) the current value $C(n)$ by the difference $D(n)$. For $T(n)\geq C(n)$, the adder 405 outputs an updated current value of $C(n)+D(n)$ while for $T(n)<C(n)$, it outputs $C(n)-D(n)$. A third comparator 402 compares the updated current value from the adder 405 with the goal value. The comparison result from the comparator 402 is input to the comparator 403. The comparator 403 detects when the current value $C(n)$ has reached the goal $T(n)$ i.e., completion of interpolation. This is indicated by either $T(n)\geq C(n)$ and $T(n)<$ adder output, or $T(n)<C(n)$ and $T(n)\geq$ adder output. The comparator 403 output controls SW1 selector 409 to select a new current value from the adder 405 output and the goal value $T(n)$. If the goal has been reached, the selector 409 selects the goal value $T(n)$. Otherwise, it selects the adder 405 output.

In accordance with the invention, there is provided a SW2 selector 410 which selects either the current value from memory 406 or a new current value from the selector 409 under the control of a control signal F. The control signal F is externally supplied from CPU 302. It takes the form of a binary signal. Logic "0" level of the control signal F enables the interpolator 301 to perform the interpolation which comprises updating the current memory 406 by writing a new current value from the selector 409 through the selector 410. Logic "1" level of the control signal F, however, inhibits the interpolator 301 from performing the interpolation; the current value read out from the current memory 406 is directly fed back to the current memory 406 without any change.

During a logic "0" period of the control signal, CPU 302 supplies a new set of parameters i.e., new goal values T(n) and new differential values D(n) to externally update the contents of the memories 408 and 407.

This arrangement makes it possible to synchronize interpolating operations among the plurality of filter coefficients. Specifically, control signal F is switched to logic "0" level after all parameters in the memories 407 and 408 have been updated by the new set of parameters from CPU 302 during logic "1" level period of control signal F during which the interpolator 301 is inhibited. At the next sampling cycle following this switching, the interpolator 301 restarts its interpolating operations using the goal and difference memories 407 and 408 having parameters all updated. This is the simultaneous restart of multicoefficient interpolations by the interpolator 301 which operates on a time divisional multiplexing basis. Therefore, the digital filter 300, which uses the interpolated coefficients from the interpolator to filter an input signal, is accurately controlled as intended by CPU 302. The simultaneous or synchronizing function is most effective for digital signal processing using a plurality of filter coefficients and having a high sensitivity to timing errors or sampling skews in the plurality of coefficients.

Though not shown in FIG. 19, CPU 302 sets the current memory 406 to initial values of current coefficients at a filter initializing time as well as initializing the difference and goal memories 407 and 408.

Figure 21:
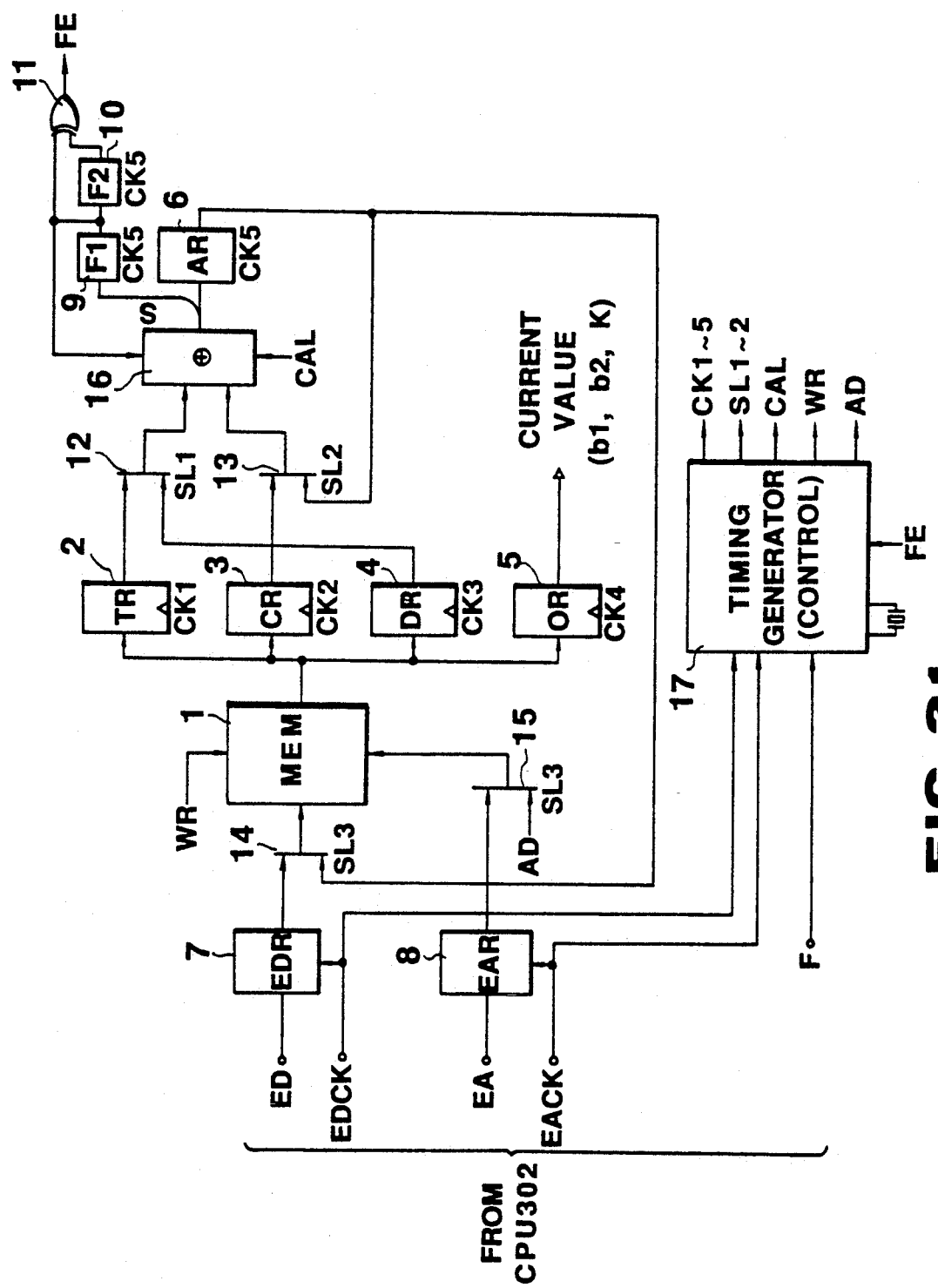
FIG. 21 is a block diagram of a detailed arrangement of the interpolator in FIG. 19.

FIG. 21 shows a more specific arrangement of the interpolator 301. Various components of the interpolator 301 are controlled by timing signals from a timing generator or control 17 to achieve a time division multiplexing function. A memory 1 stores goal, difference and current values of a plurality of filter coefficients and corresponds to the combination of memories 406 to 408 in FIG. 19.

CPU 302 supplies the interpolator with data and signals ED, EDCK, EA, EACK and F, shown at left-hand of FIG. 21. Among them, F is a single-bit binary control signal and entered into the timing generator 17. Logic "1" level of the control signal F causes the timing generator 17 to inhibit the interpolator 301 from performing interpolation, and at the same time, permits CPU 302 to update the memory 1 using ED, EDCK, EA, and EACK. A new parameter is carried by ED bus and loaded into EDR register 7 by EDCK clock applied thereto. The EDCK clock is also supplied to the timing generator 17. Address information on the new parameter is carried by EA bus and loaded into EAR register 8 by EACK clock applied thereto. EACK clock is also applied to the timing generator 17. EDR register 7 output, indicative of a new parameter, is supplied to the data input to the memory 1 via a selector 14 which is controlled by a selecting signal SL3 from the timing generator 17. EAR register 8 output, indicative of a new parameter address, is supplied to the address input to the memory 1 via a selector 15 which is also controlled by the same selecting signal SL3. Therefore, a new parameter, which has been sent from CPU 302, is written into the memory 1 at the designated address when the memory 1 receives a write signal WR from the timing generator 17. Note that this writing is enabled during a logic "1" level period of the control signal F. The selector 14 has a second input for receiving an interpolated (updated) coefficient obtained in the interpolator 301. The selector 15 has a second input for receiving address information from the timing generator 17.

Figures 22, 23:
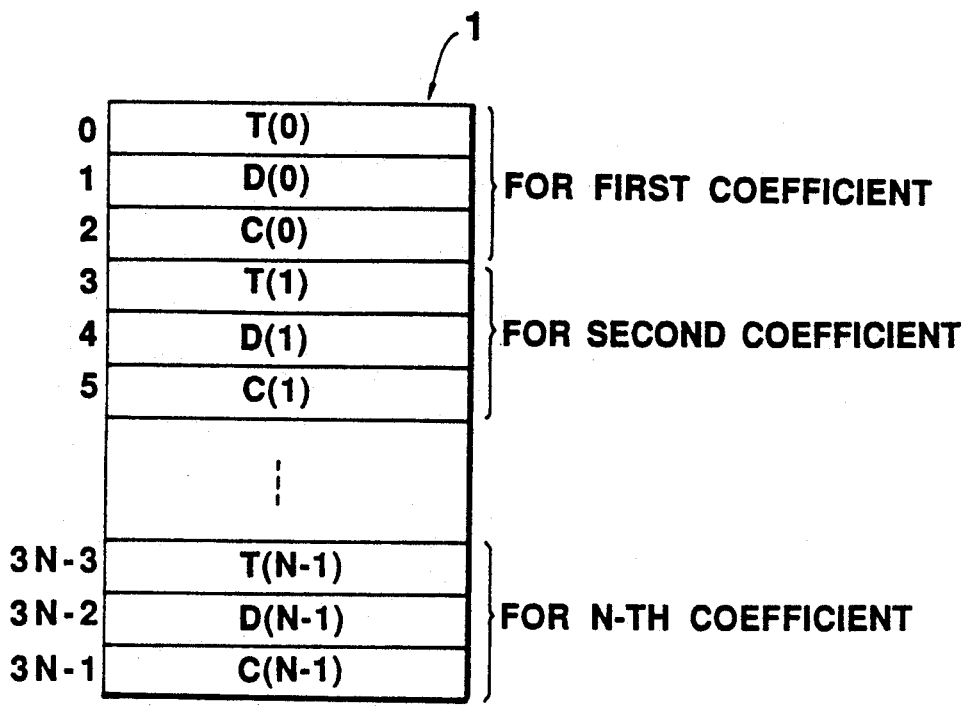
FIG. 22 shows a storage map of the memory 1 in FIG. 21.
FIG. 23 is a table showing operation of the adder/subtracter 16 in FIG. 21.

FIG. 22 illustrates parameter allocation of the memory 1. According to the illustrated allocation, a group of parameters T, D, C for each filter coefficient are placed at three successive addresses. Specifically, the first three successive addresses store parameters T(0), D(0) and C(0) for the first coefficient, the second three addresses store T(1), D(1) and C(1) for the second coefficient, and so on, and the last three addresses store T(N−1), D(N−1), and C(N−1) for N-th coefficient. These N coefficients may be used in the digital filter 300 to process a single signal or channel. If the digital filter 300 is a multichannel digital filter which processes M signal channels on a time division multiplexing according to the same algorithm, it will use N/M coefficients per each signal channel and requires 3N/M parameters on the part of the memory 1. In some application, the number of filter coefficients may be different from one signal channel to another. For a single channel digital filter of second order IIR type in FIG. 20, T(0), D(0) and C(0) may define a parameter set for b1 coefficient, T(1), D(1) and C(1) for b2 coefficient and T(2), D(2) and C(2) for K coefficient. The parameter storage allocation in FIG. 22 is merely an example. Any other storage allocation addressable by the timing generator 17 may be employed.

Turning back to FIG. 21, TR, CR, DR and OR registers 3 to 5 are provided to temporarily store a parameter output from the parameter memory 1. Specifically, TR register 2 is for storing a coefficient goal value T(n), CR register 3 for a current value C(n), DR register 4 for a differential value D(n) and OR register 5 for supplying a coefficient current value to the digital filter 300. Registers 2 to 5 are controlled by clocks CK1 to CK4, respectively, from the timing generator 17. A selector 12, which is controlled by a selecting signal SL1 from the timing generator 17, selects either a goal value output T(n) from TR register 2 or a differential value output D(n) from DR register C to provide a first input to an adder/subtracter 16. Another selector 13, which is controlled by a selecting signal SL2 from the timing generator 17, selects either a current value output from CR register 3 or an output from AR register 6 to provide a second input to the adder/subtracter 16. AR register 6 is controlled by clock CK5 from the timing generator 17 to provide the adder/subtracter 16 output.

FIG. 23 indicates how the adder/subtracter 16 is controlled by the combination of a three-bit control signal CAL from the timing generator 17, and the state of F1 flag 9 which fetches a sign bit S of the adder/subtracter 16 output at CK5 clock time. With CAL=000, the adder/subtracter 16 simply passes its first input (denoted SL1 in FIG. 23) from the selector 12 to AR register 6. With CAL=001, the adder/subtracter 16 sums its first input SL 1 and its second input, denoted SL 2, from the selector 13 and pass the sum (SL1+SL2) to AR register. With CAL=010, the adder/subtracter 16 subtracts SL1 from SL2 and passes the result (SL1−SL2) to AR register 6. With CAL=100 and F1=1, the adder/subtracter 16 executes (SL2−SL1). With CAL=100 and F1=0, it executes (SL2+SL1).

Turning back to FIG. 21, F1 flag 9 output is fetched by F2 flag 10 at the next CK5 clock time. F1 flag 9 output and F2 flag 10 output are exclusively ORed by EXOR gate 11 to develop a signal FE. The signal FE is supplied to the timing generator 17.

F1 flag 9 state indicates magnitude comparison between goal T(n) and current value C(n) at one time. At another time after this information is copied into F2 flag 10, F1 flag 9 state indicates magnitude comparison between goal T(n) and updated current value given by C(n)±D(n) where the sign is determined by the magnitude comparison between T(n) and C(n). The signal FE corresponds to the comparator 409 output in FIG. 19. From the signal FE, the timing generator 17 determines whether the current value has reached the goal or not. Specifically, FE=0 (i.e., F1=F2=1 or F1=F2=0) indicates that a new current value from the adder/subtracter 16 has not yet reached the goal, namely, the interpolating process is going on. FE=1 signals that the goal has been reached, which thus, indicates completion of the interpolating process. With FE=0 (during interpolating period), to update the current value in the memory 1 the interpolator 301 writes into the memory 1 the interpolated coefficient C(n)±D(n) from the adder/subtracter 16 by way of AR register 6 and selector 14 under the control of the timing generator 17. With FE=1 indicative of completion of interpolation process, the interpolator 301 writes into the memory 1 a goal value from TR register 2 by way of AR register 6 and the selector 14, as a current value in the memory 1.

Figure 24:
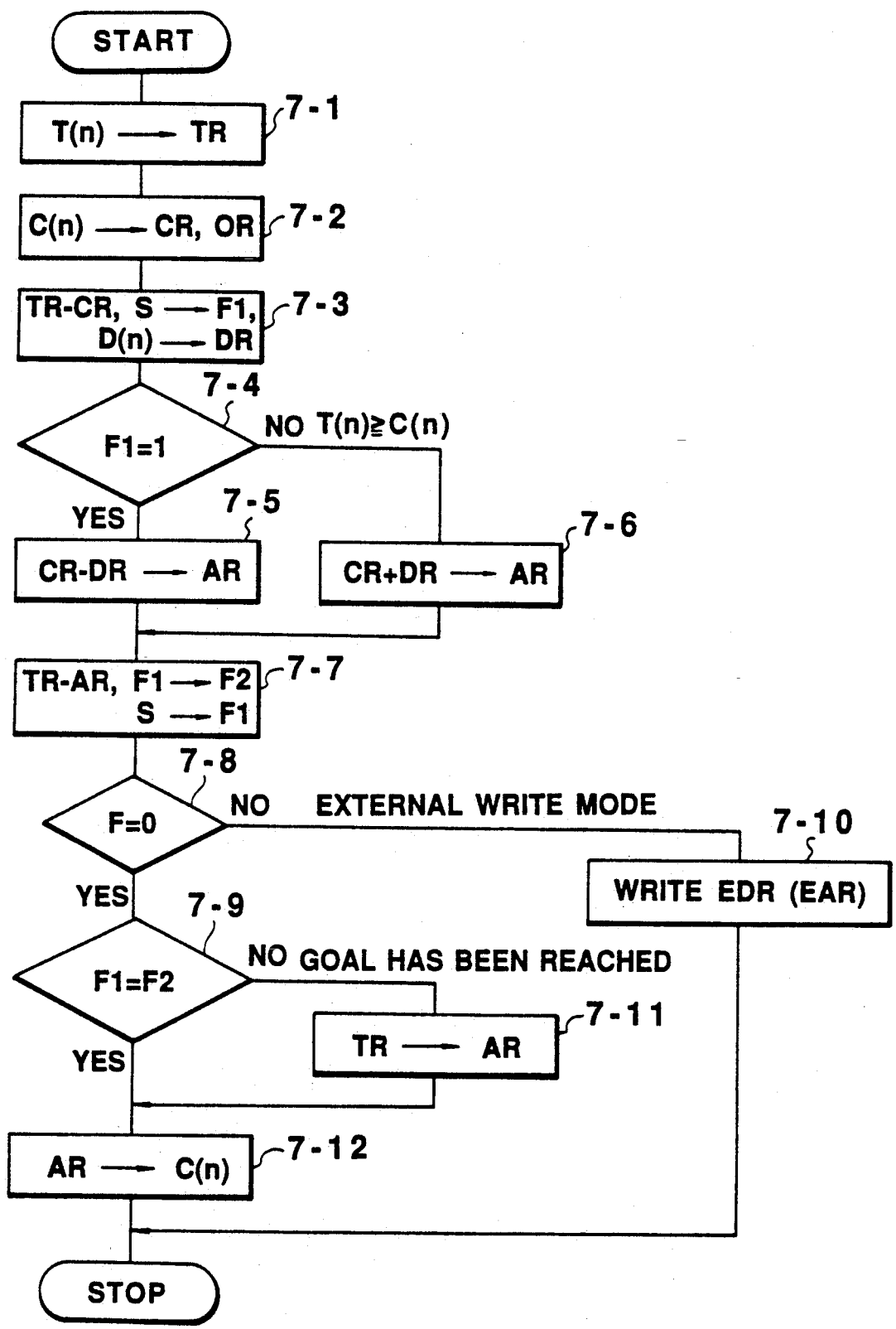
FIG. 24 is a flow chart illustrating operation of the interpolator in FIG. 21.

FIG. 24 is a flow chart of the operation of the interpolator in FIG. 21. For each pass of the flow, the interpolator generates an operative filter coefficient of the digital filter. Since the interpolator must supply the digital filter 300 a plurality of operative filter coefficients as many as needed in the digital filter, the interpolator repeats the operation of FIG. 24 as many times as the number of operative filter coefficients during each sampling cycle of the digital filter while shifting the addressing of the parameter memory 1, thus achieving a time division multiplexing.

In the first step 7-4 with a cycle of generating n-th operative coefficient, timing generator or control 17 reads, from the parameter memory 1, goal T(n) of the n-th coefficient and sets TR register 2 to T(n).

In the next step 7-2, the memory 1 outputs a current value of the n-th coefficient and loads it into CR register 3 and OR register 5 for providing an operative filter coefficient to the digital filter 300. In the step 7-3, the timing generator 17 causes the selector 12 to select the goal value T(n) from TR register 2, causes the selector 13 to select the current value T(n) from CR register 3, supplies CAL=010 to the adder/subtracter 16 to execute (TR−CR) or (T(n)−C(n)), the sign bit S of which is then set into F1 flag 9, and reads a differential value D(n) of the n-th coefficient from the memory 1 to load it into DR register 4.

As a result, at step 7-4, F1 flag 9 supplies the adder/subtracter 16 the sign bit F1 indicative of the magnitude comparison between the goal T(n) and the current value C(n). At this time, the timing generator 16 applies CAL=100 to the adder/subtracter 16. Thus, if F1=1, i.e., goal T(n)<current value C(n), the adder/subtracter 16 executes C(n)−D(n) as shown in block 7-5, while if F1=0, i.e., T(n)≧C(n), it executes C(n)+D(n), as shown in block 7-6. The adder/subtracter 16 output is then loaded into AR register 6 under the control of the timing generator 17.

In step 7-7, the timing generator 17 causes the selector 12 to select the goal T(n) from TR register 2, causes the selector 13 to select the updated current value C(n)±D(n) from AR register 6, and supplies CAL=010 to the adder/subtracter 16 to execute (goal value T(n)-the updated current value). Further, the timing generator 17 moves the state of F1 flag 9, indicative of the magnitude comparison between the goal T(n) and the (old) current value C(n), to F2 flag 10, and sets F1 flag 9 to the sign bit S from the adder/subtracter 16, indicative of the magnitude comparison between the goal T(n) and the new or updated current value C(n)±D(n).

The following process depends on the control signal F supplied from external CPU 302 (7-8). If F=1, the timing generator 17 executes new parameter writing into the memory 1 (7-10) assuming that a new parameter has been supplied from CPU 302. Strictly, the writing should be executed when EDR and EAR registers 7 and 8 have been loaded with correct information i.e., a new parameter and a corresponding address. To assure this, strobe signals EDCK and EACK which are sent from CPU 302 to load EDR and EAR registers 7 and 8 with data on ED bus and on EA bus, respectively, are also supplied to the timing generator 17. Then, the timing generator 17 causes the selector 14 to select EDR register 7 i.e., new parameter, causes the selector 15 to select EAR register 8 output, and applies a write signal WR to the memory 1 to execute the new parameter writing.

As seen in FIG. 24, operations following the new parameter writing (parameter updating) 7-10 do not include any process that feeds back to the parameter memory 1 with a new sample of current coefficient created by the adder/subtracter 16. In this way, the interpolator 301 is inhibited from performing the interpolation while an external write mode is established by F=0. Each current value C(n) in the memory 1 is fixed and supplied, as the fixed operative coefficient, to the digital filter 300 by OR register 5. Therefore, once setting F to "0" external CPU 302 can freely supply a new set of parameters, one at a time through ED, EA, EDCK and EACK to update the parameter memory 1 with the new set, as indicated in the time chart of FIG. 25.

Figure 25:
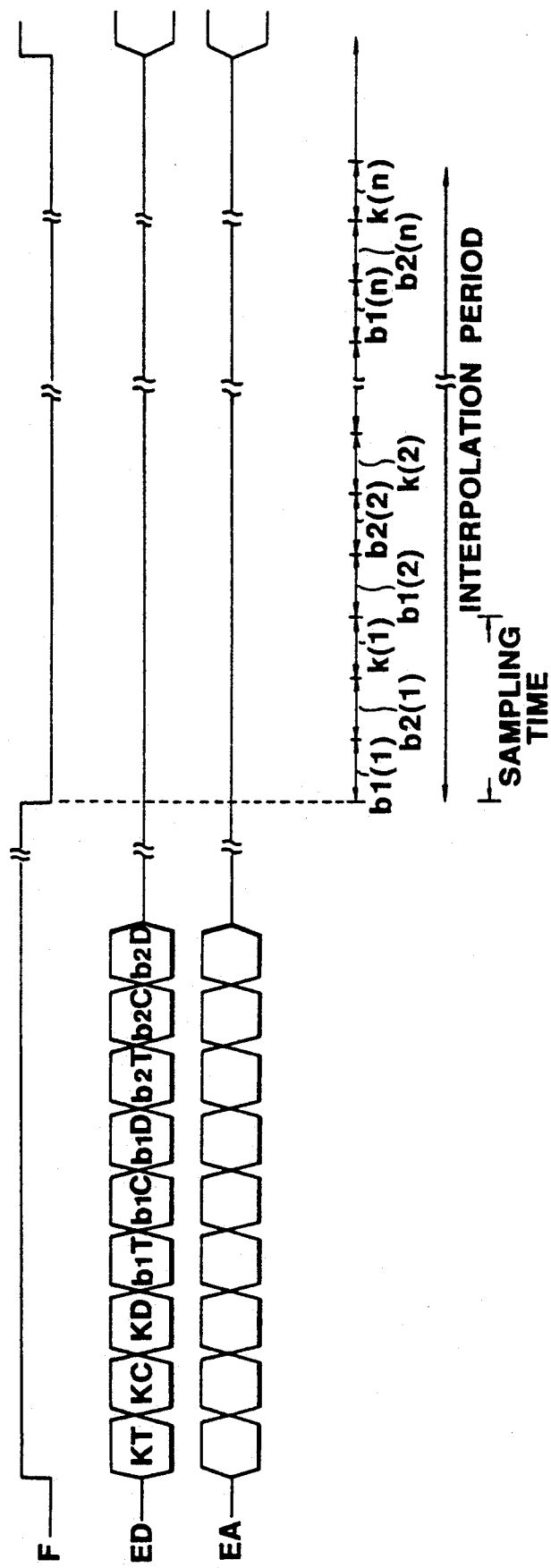
FIG. 25 is a time chart of the interpolator in FIG. 21.

In FIG. 25, the second order IIR filter shown in FIG. 20 is assumed for the digital filter 300. At the filter initializing time, CPU 302 sends the interpolator 301 the following parameters: goal, current and differential values, KT, KC and KD for K coefficient; goal, current and differential values, b1T, b1C and b1D for b1 coefficient; and goal, current and differential values b2T, b2C and b2D for b2 coefficient. For the following updating times, current parameters KC, b1C, b2C are not sent to avoid skipping of operative filter coefficients of the digital filter.

As indicated in FIG. 25, CPU 302 switches F to "0" after having sent a new parameter set. Within the interpolator 301, the transition of the control signal F will be made effective from the beginning of the next sampling cycle in which the interpolator 301 produces a set of operative coefficients for the digital filter 302. To this end, the timing generator 17 includes a delayed (synchronizing) flip flop (not shown) with a data input for receiving the control signal F directly supplied from CPU 302. The flip flop is controlled by a synchronizing signal generated in synchronism with the sampling cycle. Thus, if the control input F is changed to "0", this will change the flip flop state at the next occurrence of the synchronizing signal. The delayed and synchronized control signal F from the flip flop is used by the timing generator 17 in step 7-8 in FIG. 22 as a conditional branching signal.

In this way, if CPU 302 changes the control signal F to logic "0" level at some time in a sampling cycle, the interpolator 301 will detect F=0 at step 7-8 in the next sampling cycle. During a period of F=0, the timing generator 17 operates differently depending on the signal FE from the EXOR gate 11. If FE=0 (F1=F2), the updated current value $C(n) \pm D(n)$ has not yet reached the goal value T(n). Thus, the timing generator 17 writes the updated (newly interpolated) current value into the memory 1 from AR register 6 through the selector 14 (7-12). On the other hand, if FE=1 (F1 is unequal to F2), the goal has been reached so that the timing generator 17 supplies CAL=000 to the adder/subtracter 16 to move the goal value T(n) from TR register 2 to AR register 6, and then moves the goal value T(n) from AR register 6 to the memory 1 at the address of the current value (7-11, 7-12).

In this manner, from the sampling cycle immediately after the transition of the control signal F into logic "0" level, the interpolator 17 restarts interpolating operations on the plurality of coefficients C(0), C(1), C(2) and so on using parameters all updated by CPU 302.

Figure 26:
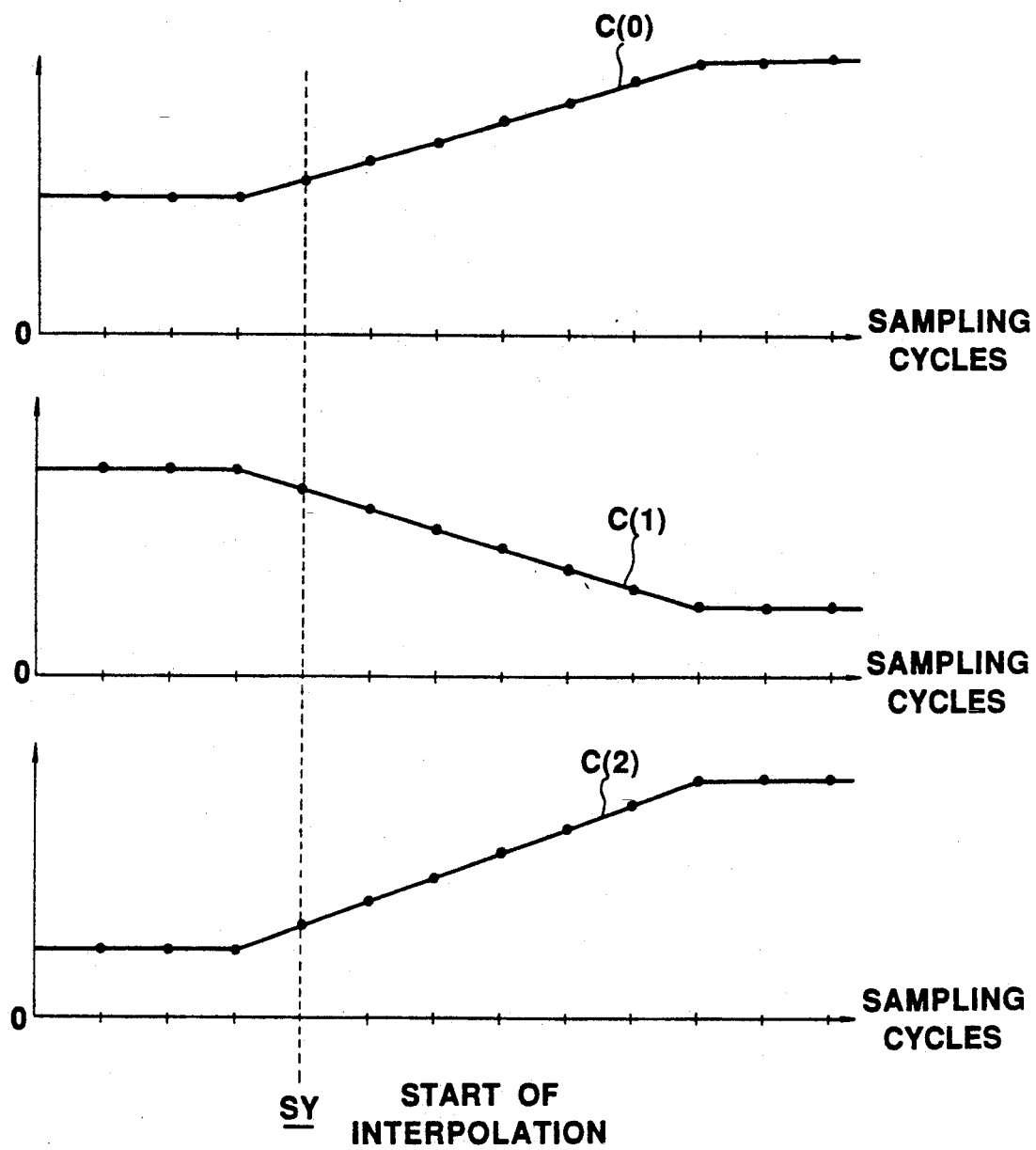
FIG. 26 is another time chart of the interpolator in FIG. 21.

FIG. 26 shows how the coefficient interpolation proceeds in the interpolator 301. As indicated by SY, the interpolation starts from the sampling cycle next to the switching of the control signal F into logic "0" level. Within this sampling cycle, the interpolator 301 produces a first set of interpolated coefficient samples one at a time. This assures synchronous interpolations performed by a time-division-multiplexing based system i.e., the interpolator. The synchronous function of the interpolator 301 allows CPU 302 to control the digital filter 300 with high accuracy and on a real-time basis.

The prior art interpolator directly uses parameters supplied from the CPU which operates asynchronously with the interpolator. Therefore, interpolations of a plurality of filter coefficients start at different sampling cycles from one filter coefficient to another, giving rise to timing errors or sampling skews among the filter coefficients, which can provide serious damage to the digital signal processing involving a high sensitivity to coefficient errors.

This problem is eliminated by the interpolator of the invention.

Figure 27:
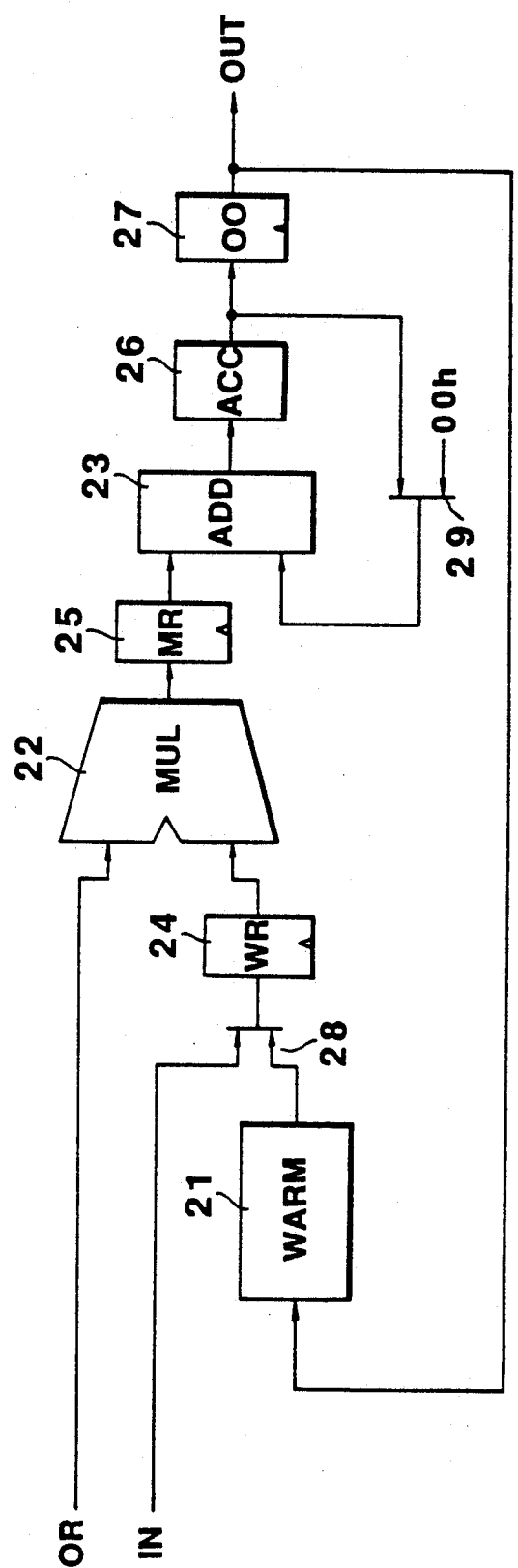
FIG. 27 is a block diagram of an arrangement of a digital signal processing circuit usable to realize the second order IIR filter in FIG. 20.
Figure 28:
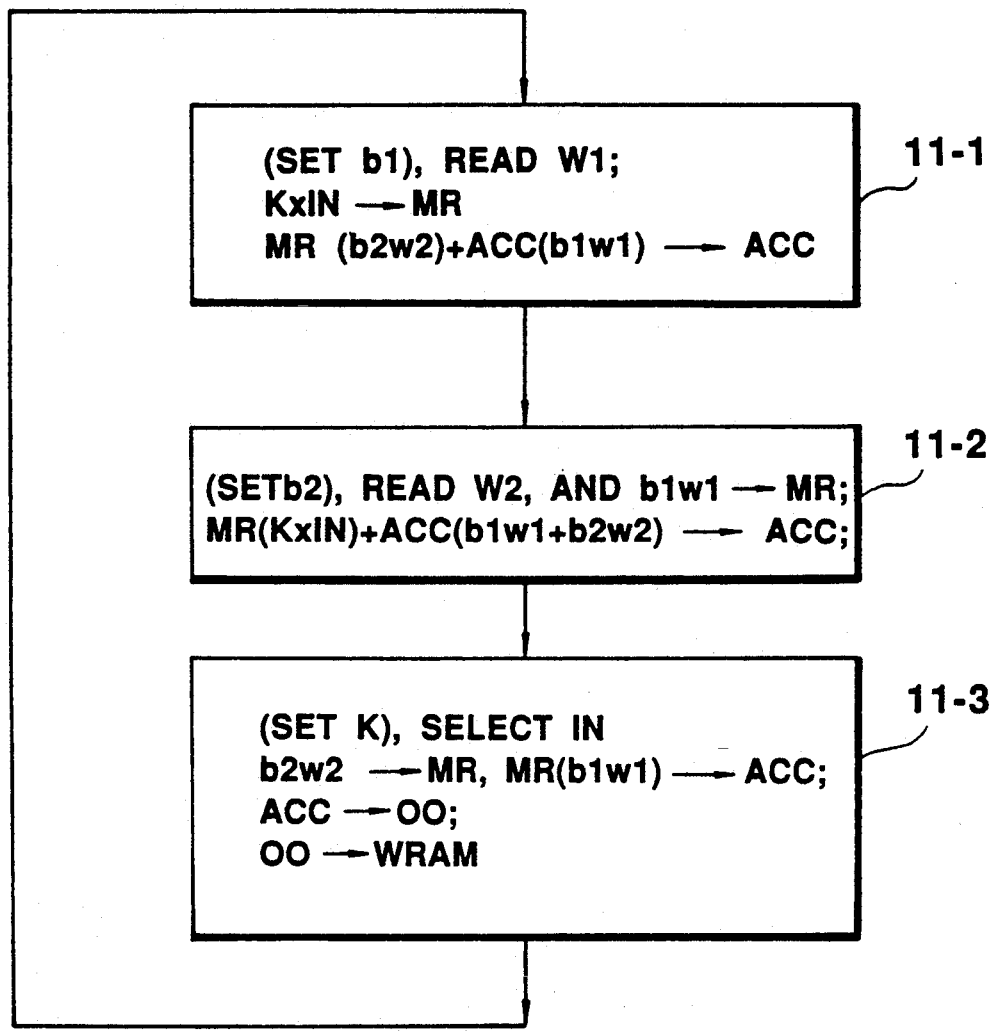
FIG. 28 is a flow chart illustrating operation of the digital signal processing circuit in FIG. 27.

FIG. 27 shows a digital signal processing circuit which can realize the second order IIR digital filter in FIG. 20. FIG. 28 shows a flow chart of the operation of the processing circuit.

Though not shown in FIG. 27, various control signals are supplied to various parts of the processing circuit. The timing generator 17 in FIG. 21 may provide such control signals.

According to the flow of FIG. 28, the processing circuit of FIG. 27 processes three signals.

At step 11-1 in FIG. 28, the processing circuit, which is pipeline structured, reads from WRAM memory 21, a preceding sample w1 of i-th output signal (where i=0 to 2) and loads it into WR register 24 via selector 28. At this time, the interpolator 301 in FIG. 21 produces a coefficient b1 and loads it into OR register 5. In addition, at step 11-1, the processing circuit performs a partial processing of (i−1)mod3-th signal according to the nature of pipelining. Specifically, the processing circuit causes a multiplier 22 to multiply a sample of the (i−1)mod3-th input signal IN and a sample of K coefficient from OR register 5 (FIG. 21), and loads the result (K×IN) into MR register 25. Further, the processing circuit causes an adder 23 to add a sample of b2w2 from MR register 25 and a sample of b1w1 from ACC register (accumulator) 26 via selector 29, and reloads the result (b1w1+b2w2) into ACC register 26.

At the next step 11-2, the processing circuit causes the multiplier 22 to multiply the previous sample w1 of the i-th output signal from WR register 24 and b1 coefficient from OR register 5, and loads the result (b1×w1) into MR register 25. At the same time, the interpolator 301 loads a current sample of b2 coefficient into OR register 5. Further, the processing circuit loads a second preceding sample w2 of the i-th output signal OUT into WR register 24 from WRAM memory 21. For the (i−1)mod3-th signal, the processing circuit causes the adder 23 to add K×IN from MR register 25 and (b1×w1+b2×w2) from ACC register 26, loads into ACC register 26 the result indicative of a new sample of the (i−1)mod3-th output signal.

At step 11-3, the processing circuit causes the multiplier 22 to multiply the second preceding sample w2 of the i-th output signal OUT from WR register 25 and b2 coefficient from OR register 5, and loads the result (b2×w2) into MR register 25, loads a current sample IN of the i-th input signal into WR register 24 via the selector 28. At the same time, the interpolator 301 loads a current sample of K coefficient into OR register. The precessing circuit moves b1w1 from MR register to ACC register 26 via the adder 23 which now receives "0" from the selector 29. For the (i−1)mod3-th signal, the processing circuit moves the new sample of the (i−1)mod3-th output signal from ACC register 26 to OO register 27 for actually providing the output signal sample, and writes into WRAM 21 a sample of (i−1)mod3-th output signal from OO register 27.

After the step 11-3, the processing circuit processing while changing addressing to WRAM 21.

To produce (and store) one sample of an output signal OUT, the processing circuit in FIG. 27 repeats the loop of FIG. 28 three times.

In the first passing of the loop: The processing circuit reads b1 coefficient and the first preceding sample w1 of the output signal at 11-1. At 11-2, it executes b1×w1 and reads the second preceding sample w2 of the output signal, and at 11-3, it initializes ACC to b1×w1, executes b2×w2, and reads K coefficient and a current sample of the input signal IN.

In the second passing of the loop: At 11-1, the processing circuit executes K×IN, adds b2×w2 to ACC to obtain (b1×w1+b2×w2); At 11-2, it adds K×IN to ACC to obtain a sample of the output signal, and sets OO to the sample.

In the third passing of the loop: At 11-3 the processing circuit writes the sample from OO to WRAM.

The process described above is equivalent to that performed by the second order IIR digital filter in FIG. 20. In other words, the processing circuit in FIG. 27 realizes the functional arrangement of the digital filter in FIG. 20 by performing the processing according to the flow of FIG. 28.

In FIG. 20, a first delay element 46 receives a sample of output signal OUT and introduces a delay of one sampling cycle to provide a first preceding sample w1 of the output signal. A second delay element 47 coupled to the first delay element 46 introduce an additional delay of one sampling time to provide a second preceding sample w2 of the output signal. A multiplier 42 multiplies the first preceding sample w1 by b1 coefficient. Another multiplier 43 multiplies the second preceding sample w2 by b2 coefficient. An adder 45 adds b1w1 from the multiplier 42 and b2w2 from the multiplier 43. A multiplier 41 multiplies a sample of the input signal IN by K coefficient. An adder 44 adds KI from the multiplier 41 and (b1w1+b2w2) from the adder 45 to produce a sample of the output signal.

In summary, the digital filter system of the second embodiment employs CPU 302 that supplies the interpolator 301 the control signal F. With F=1, CPU 302 can freely send the interpolator 301 a new set of parameters. In the meantime, the interpolator 301 is inhibited from performing the interpolations while allowing the parameter memory 1 to be updated to the new parameter set from CPU 302. In response to the transition of the control signal F from "1" to "0", the interpolator 301 restarts the synchronized interpolations of a plurality of operative filter coefficients using the updated parameters. The interpolated samples of the operative filter coefficients are used in the digital filter 300 for processing or filtering a digital signal such as digital tone signal. Therefore, CPU 302, in cooperation with the interpolator 301, can dynamically control the digital filter 300 with high accuracy and on a real-time basis. The operating filter coefficients that determine the operating point of the digital filter 300 are controlled with a smooth change and in synchronism with one another.

Figure 29:
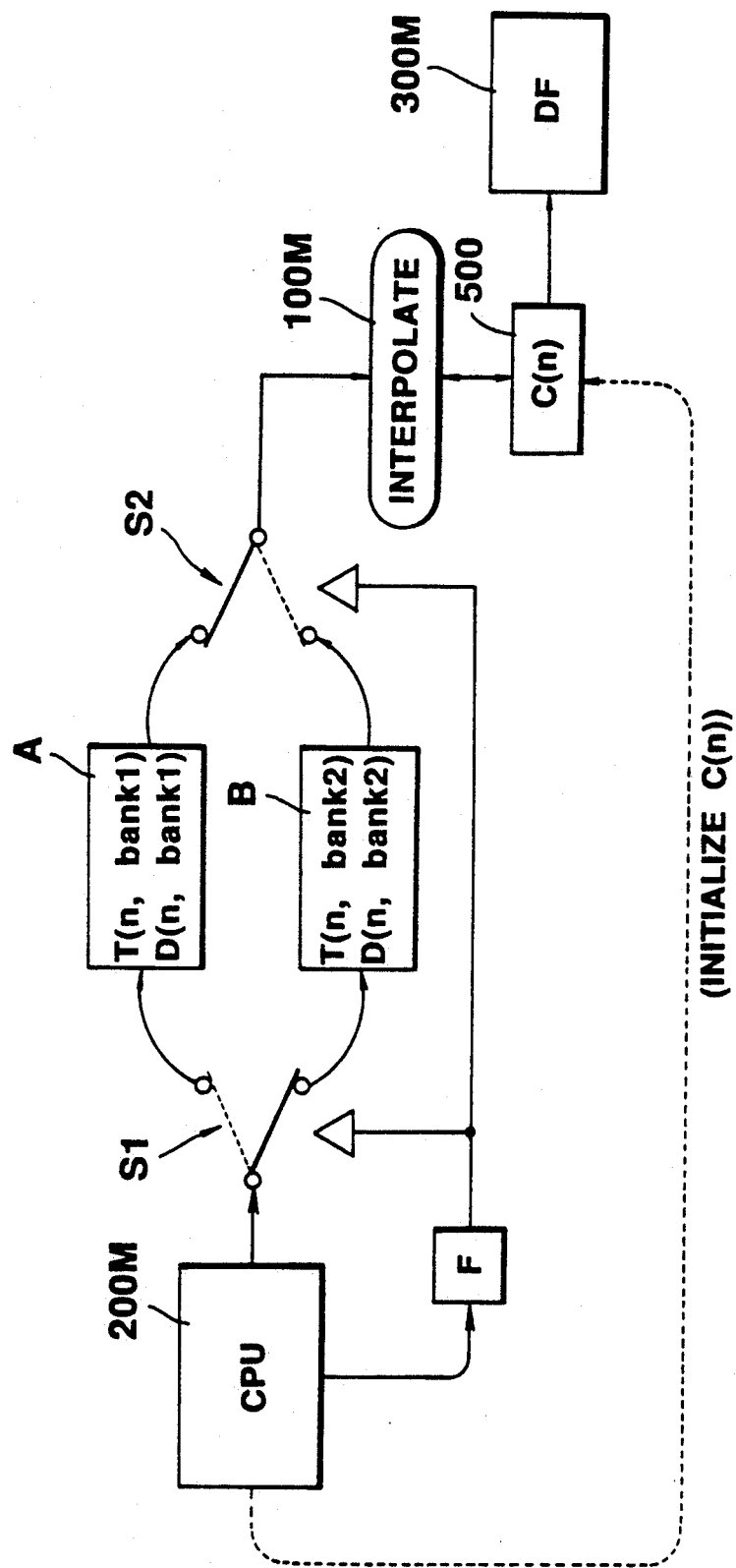
FIG. 29 shows a basic arrangement of a modified interpolator.
Figure 30:
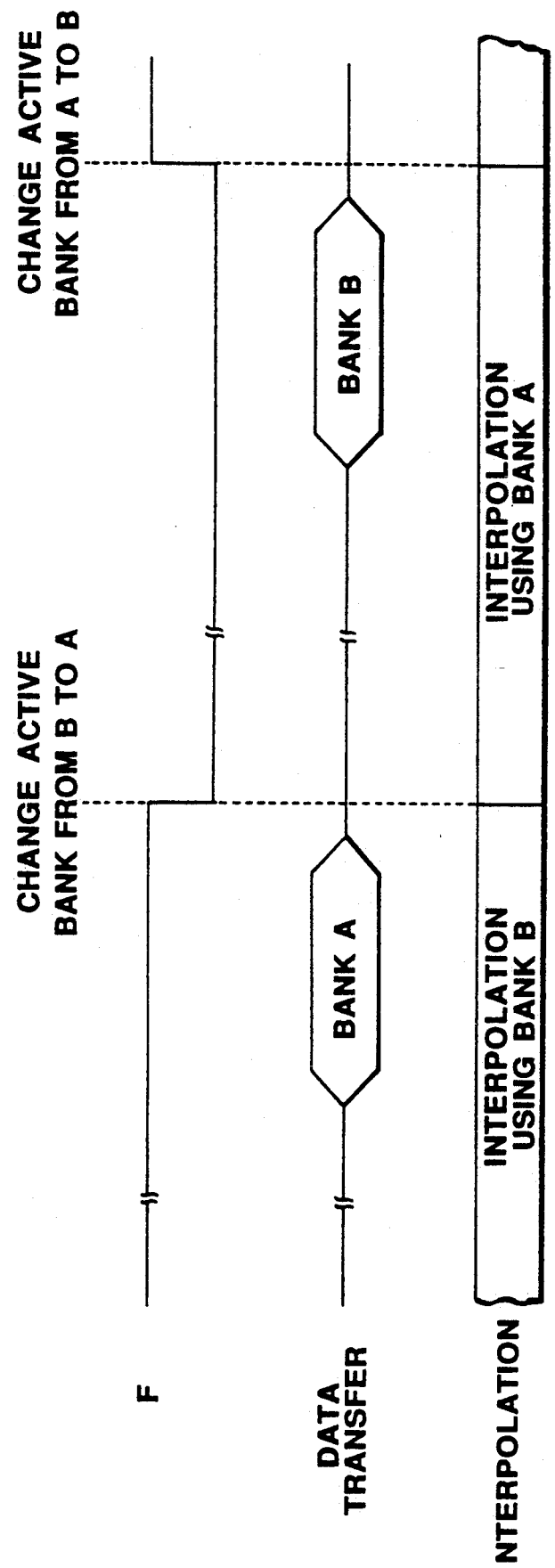
FIG. 30 is a time chart of the interpolator in FIG. 29.

FIG. 29 shows a basic arrangement of a modified digital filter system. FIG. 30 shows the operation thereof. This system employs two memory banks A and B for parameter storage. These two banks A and B are alternately referenced by interpolator 100M under the control of a control signal F supplied from CPU 200M.

If the control signal F is at a first level, e.g., logic "0" level, selectors S1 and S2 are each placed at a position indicated by a solid line. Accordingly a set of new parameters comprising new goals and differential values are supplied to bank B from CPU 200M via selector S1. Meanwhile, the interpolator 100M reads parameters from bank A via the selector S2 to interpolate or update a current value C(n) of each filter coefficient in current memory 500, which is then supplied to digital filter 300M.

When the control signal F is changed to logic level "1", this causes the selectors S1 and S2 to move to a position indicated by a dot line. A new parameter set from CPU 200M are now written into bank A via the selector S1. Bank B, which now serves as an active parameter memory, supplies stored parameters to the interpolater 100M via selector S2 for interpolation of the current values in the memory 500 (see FIG. 30).

At an initial time, CPU 200M initializes the current memory 500 in the same manner as the second embodiment. Thereafter, the digital filter system operates as described above.

The digital filter system in FIG. 29 requires an increased storage capacity, two times that of the second embodiment, for storing goal and differential parameters. The system, however, has the advantage that the interpolator 100M can run continously; no inhibited period is needed for updating the parameters. Since CPU 200M can predict from the goal and differential values, and the operation speed of the interpolator, when the operative filter coefficients reach the goal, it can send new parameters at an appropriate time after changing the control signal F level. In doing so, when a goal has been reached, the interpolator will restart interpolating of coefficients toward the new goal without any substantial delay, thus providing more continous control of the digital filter.

In the second embodiment, exact synchronism is accomplished among interpolating operations on a plurality of filter coefficients by providing the synchronizing means within the timing generator 17 which synchronizes the external control signal F from CPU 302 with its internal sampling cycle. Such synchronizing means may be omitted, however, except for applications with most severe requirements of digital signal processing, because such omission will only introduce at most one sampling time error among the coefficients.

If desired, one of the memory banks A and B may be dedicated to the active memory while the other dedicated to the parameter buffer for receiving a parameter set from CPU. In this case, parameter transfer from the parameter buffer to the active memory may occur in response to an edge of a single bit control signal such as the control signal F or a particular level of a multibit control signal.

The first embodiment may be combined with the second embodiment so as to smoothly move the operative cutoff frequency while keeping synchronism among a plurality of time-varying filter coefficients.

This concludes the detailed description. However, various modifications and alterations will be obvious to a person having ordinary skill in the art without departing from the scope of the invention.

What is claimed is:

1. A digital filter system comprising:
   filter coefficient storage means for storing filter coefficients corresponding to discrete cutoff frequencies, respectively;
   goal storage means for storing a goal value of cutoff frequency;
   coefficient readout means for reading out filter coefficients corresponding to the goal value of the cutoff frequency stored in said goal storage means from said filter coefficient storage means;
   filter means for receiving filter coefficients from said coefficient readout means and for filtering a signal input thereto in accordance with the received filter coefficients;
   desired cutoff frequency varying means for varying a desired value of the cutoff frequency;
   detecting means for detecting a difference between the desired value of the cutoff frequency from said desired cutoff frequency varying means and the goal value of the cutoff frequency stored in said goal storage means;
   updating means responsive to said detecting means when said detected difference is larger than a predetermined value, for calculating a new goal value of cutoff frequency that is located between said goal value stored in said goal storage means and said desired value, and for updating said goal storage means with said new goal value of cutoff frequency; and
   repeating means for repeating operations of said detecting means, said updating means and said coefficient readout means until said detected difference is reduced to a relatively small value.

2. The digital filter system of claim 1 wherein:

said desired cutoff frequency varying means comprises manually operable means for variably inputting the desired value of the cutoff frequency.

3. The digital filter system of claim 1 wherein:
said desired cutoff frequency varying means comprises function generator means for automatically generating a time-varying function for the desired cutoff frequency.

4. The digital filter system of claim 1 wherein:
said filter coefficient storage means comprises means for storing filter coefficients at each of a plurality of discrete cutoff frequencies represented in a cent-proportional scheme; and
said desired cutoff frequency varying means comprises means for varying the desired value of the cutoff frequency in a cent-proportional scheme.

5. A digital filter system comprising:
filter coefficient storage means for storing filter coefficients corresponding to discrete cutoff frequencies, respectively;
goal storage means for storing a goal value of cutoff frequency;
coefficient readout means for reading out filter coefficients corresponding to the goal value of the cutoff frequency stored in said goal storage means from said filter coefficient storage means;
desired cutoff frequency varying means for varying a desired value of the cutoff frequency;
measuring means for measuring a difference between a desired value of the cutoff frequency newly supplied from said desired cutoff frequency varying means and the goal value of the cutoff frequency as an old goal value from said goal storage means;
updating means, responsive to said measuring means when said difference is relatively large, for calculating a new goal value of the cutoff frequency that is located between said old goal value and said desired value newly supplied, and for updating said goal storage means by replacing said old goal value with said new goal value;
changing rate calculating means for calculating changing rates of filter coefficients that are variables in proportion to difference between those filter coefficients at said old goal value and those filter coefficient at said new goal value; and
filter means for receiving filter coefficients from said coefficient readout means and changing rates from said changing rate calculating means, and for filtering an input signal in accordance with the received filter coefficients and changing rates.

6. The digital filter system of claim 5 wherein:
said desired cutoff frequency varying means comprises manually operable means for variably inputting the desired value of the cutoff frequency.

7. The digital filter system of claim 5 wherein:
said desired cutoff frequency varying means comprises function generator means for automatically generating a time-varying function for the desired cutoff frequency.

8. The digital filter system of claim 5 wherein:
said filter coefficient storage means comprises means for storing filter coefficients at each of a plurality of discrete cutoff frequencies represented in a cent-proportional scheme; and
said desired cutoff frequency varying means comprises means for varying the desired value of the cutoff frequency in a cent-proportional scheme.

9. A digital filter system comprising:
filter coefficient storage means for storing filter coefficients corresponding to discrete cutoff frequencies, respectively;
desired cutoff frequency varying means for varying a desired value of cutoff frequency;
goal calculating means for, when a difference between a newly desired value of the cutoff frequency from said desired cutoff frequency varying means and an old goal value of the cutoff frequency is larger than a predetermined value, calculating a new goal value of the cutoff frequency having a reduced difference, smaller than said first-mentioned difference, from said old goal value of the cutoff frequency;
coefficient readout means for reading out filter coefficients corresponding to said new goal value of the cutoff frequency calculated by said goal calculating means; and
filter means for filtering a signal input thereto in accordance with filter coefficients from said coefficient readout means.

10. The digital filter system of claim 9 further comprising:
rate calculating means for calculating changing rates of filter coefficients that are variable in proportion to differences between those filter coefficients at said new goal value of the cutoff frequency and those filter coefficients at said old goal value of the cutoff frequency; and
transferring means for transferring said changing rates together with said filter coefficients at said new goal value to said filtering means.

11. The digital filter system of claim 9 wherein:
said desired cutoff frequency varying means comprises manually operable means for variably inputting the desired value of the cutoff frequency.

12. The digital filter system of claim 9 wherein:
said desired cutoff frequency varying means comprises function generator means for automatically generating a time-varying function for the desired cutoff frequency.

13. The digital filter system of claim 9 wherein:
said filter coefficient storage means comprises means for storing filter coefficients at each of a plurality of discrete cutoff frequencies represented in a cent-proportional scheme; and
said desired cutoff frequency varying means comprises means for varying the desired value of the cutoff frequency in a cent-proportional scheme.

14. A digital filter system comprising:
filter coefficient storage means for storing filter coefficients corresponding to a plurality of discrete cutoff frequencies, respectively;
cutoff frequency storage means for storing a cutoff frequency;
coefficient readout means for reading out filter coefficients corresponding to the cutoff frequency stored in said cutoff frequency storage means from said filter coefficient storage means;
filter means for receiving filter coefficients from said coefficient readout means and for filtering a signal input thereto based on the received filter coefficients;
desired cutoff frequency varying means for varying a desired cutoff frequency;
detecting means for detecting a difference between the desired cutoff frequency varied by said desired cutoff frequency varying means and the cutoff frequency stored in said cutoff frequency storage means;

updating means, responsive to said detecting means when said detected difference is larger than a predetermined value, for calculating a new cutoff frequency corresponding to the filter coefficient stored in said filter coefficient storage means, said new cutoff frequency falling within a range between said cutoff frequency stored in said cutoff frequency storage means and said desired cutoff frequency varied by said desired cutoff frequency varying means, and for replacing the cutoff frequency stored in said cutoff frequency storage means with the new cutoff frequency thus calculated; and repeating means for repeatedly causing said detecting means to perform a detecting operation, said updating means to perform calculating and replacing operations, and said coefficient readout means to perform a reading out operation, until the difference detected by said detecting means becomes smaller than a predetermined value.

15. The digital filter system of claim 14, wherein:
said desired cutoff frequency varying means comprises manually operable means for variably inputting the desired value of the cutoff frequency.

16. The digital filter system of claim 14, wherein:
said desired cutoff frequency varying means comprises function generator means for automatically generating a time-varying function for the desired cutoff frequency.

17. The digital filter system of claim 14, wherein:
said filter coefficient storage means comprises means for storing filter coefficients at each of a plurality of discrete cutoff frequencies represented in a cent-proportional scheme; and
said desired cutoff frequency varying means comprises means for varying the desired value of the cutoff frequency in a cent-proportional scheme.

18. The digital filter system comprising:
filter coefficient storage means for storing filter coefficients corresponding to discrete cutoff frequencies, respectively;
desired cutoff frequency varying means for varying a desired cutoff frequency;
calculating means for detecting a difference between the desired cutoff frequency varied by said desired cutoff frequency varying means and a previous cutoff frequency, and for calculating a new cutoff frequency so as to reduce the difference between the desired cutoff frequency and the newly calculated cutoff frequency, when the detected difference is larger than a predetermined value;
coefficient readout means for reading out filter coefficients corresponding to the cutoff frequency calculated by said calculating means from said filter coefficient storage means; and
filter means for filtering a signal input thereto based on the filter coefficients received from said coefficient readout means.

* * * * *